US011814169B2

United States Patent
Fuller et al.

(10) Patent No.: US 11,814,169 B2
(45) Date of Patent: Nov. 14, 2023

(54) UNTETHERED FLYING MICRO-ROBOTS

(71) Applicant: University of Washington, Seattle, WA (US)

(72) Inventors: Sawyer Fuller, Seattle, WA (US); Shyamnath Gollakota, Seattle, WA (US); Johannes James, Seattle, WA (US); Vikram Subramaniam Iyer, Seattle, WA (US); Yogesh M. Chukewad, Seattle, WA (US)

(73) Assignee: UNIVERSITY OF WASHINGTON, Seattle, WA (US)

( * ) Notice: Subject to any disclaimer, the term of this patent is extended or adjusted under 35 U.S.C. 154(b) by 356 days.

(21) Appl. No.: 17/053,318

(22) PCT Filed: May 10, 2019

(86) PCT No.: PCT/US2019/031871
§ 371 (c)(1),
(2) Date: Nov. 5, 2020

(87) PCT Pub. No.: WO2019/217923
PCT Pub. Date: Nov. 14, 2019

(65) Prior Publication Data
US 2021/0070439 A1    Mar. 11, 2021

Related U.S. Application Data

(60) Provisional application No. 62/670,310, filed on May 11, 2018.

(51) Int. Cl.
*B64C 39/02*     (2023.01)
*H02S 10/40*     (2014.01)
(Continued)

(52) U.S. Cl.
CPC ............ *B64C 39/024* (2013.01); *B64C 13/20* (2013.01); *B64C 13/26* (2013.01); *B64C 33/025* (2013.01);
(Continued)

(58) Field of Classification Search
CPC ....... B64C 39/024; B64C 13/20; B64C 13/26; B64C 33/02; B64C 33/025; H02S 10/40;
(Continued)

(56) References Cited

U.S. PATENT DOCUMENTS

| 8,700,233 | B1* | 4/2014 | Doman | ................. B64C 39/028 701/4 |
| 11,201,505 | B2* | 12/2021 | Mor | ........................ H02J 50/30 |

(Continued)

FOREIGN PATENT DOCUMENTS

WO     2014204243 A1     12/2014

OTHER PUBLICATIONS

"Liftoff of a 190 mg Laser-Powered Aerial Vehicle: The Lightest Untethered Robot to Fly." Autonomous Insect Robotics Laboratory, University of Washington. Johannes James et al., University of Washington, Seattle, WA, USA. [Video] Available at <http://depts.washington.edu/airlab/ICRA2018-1996.html>.
(Continued)

*Primary Examiner* — Richard G Davis
(74) *Attorney, Agent, or Firm* — Perkins Coie LLP

(57) ABSTRACT

An aerial robot system may include an aerial robot having an airframe, a piezo actuator, a wing connected to the piezo actuator, and a photovoltaic cell. The system may further include a laser source configured to emit a laser beam oriented toward the photovoltaic cell for conversion by the photovoltaic cell into electrical energy. The aerial robot may further include a boost converter connected to the photovoltaic cell and configured to raise a voltage level of the
(Continued)

electrical energy, and a signal generator connected to the boost converter and configured to generate an alternating signal. The piezo actuator is connected to the signal generator to move according to the alternating signal to cause the wing to move in a flapping motion to generate aerodynamic force that moves the robot. Methods for manufacturing aerial robots and corresponding electronics are also disclosed herein.

20 Claims, 13 Drawing Sheets

(51) Int. Cl.
| | |
|---|---|
| H02S 30/10 | (2014.01) |
| H02S 40/30 | (2014.01) |
| B64C 13/20 | (2006.01) |
| B64C 13/26 | (2006.01) |
| B64C 33/02 | (2006.01) |
| B64U 50/31 | (2023.01) |
| H10N 30/20 | (2023.01) |
| H02M 3/156 | (2006.01) |
| B64U 10/40 | (2023.01) |
| B64U 50/19 | (2023.01) |
| B64U 50/34 | (2023.01) |

(52) U.S. Cl.
CPC .............. *B64U 50/31* (2023.01); *H02S 10/40* (2014.12); *H02S 30/10* (2014.12); *H02S 40/30* (2014.12); *H10N 30/2045* (2023.02); *B64C 33/02* (2013.01); *B64U 10/40* (2023.01); *B64U 50/19* (2023.01); *B64U 50/34* (2023.01); *B64U 2201/10* (2023.01); *H02M 3/156* (2013.01)

(58) Field of Classification Search
CPC ......... H02S 30/10; H02S 40/30; B64U 10/40; B64U 50/19; B64U 50/31; B64U 50/34
See application file for complete search history.

(56) References Cited

U.S. PATENT DOCUMENTS

| | | | | |
|---|---|---|---|---|
| 2006/0226816 | A1* | 10/2006 | Wai | H02M 1/34 323/222 |
| 2007/0200027 | A1 | 8/2007 | Johnson | |
| 2012/0292438 | A1* | 11/2012 | Sreetharan | B64C 39/028 74/108 |
| 2014/0060616 | A1* | 3/2014 | Okandan | H02S 40/36 136/244 |
| 2014/0131510 | A1 | 5/2014 | Wang et al. | |
| 2015/0307191 | A1* | 10/2015 | Samuel | B64C 33/02 244/22 |
| 2016/0079810 | A1* | 3/2016 | Frantz | H02S 10/00 307/104 |
| 2017/0183095 | A1* | 6/2017 | Liu | B64C 39/024 |

OTHER PUBLICATIONS

"A New Robot Fly Design That is Easy to Fabricate and Capable of Flight and Ground Locomotion." Y.M. Chukewad, et al., University of Washington, Seattle, WA USA. [Video] Available at: <http://depts.washington.edu/airlab/IROS2018-1906.html>.
"Wibotic," 2017. [Online], Available: http://www.wibotic.com/.
B. Liu, L. Ristroph, A. Weathers, S. Childress, and J. Zhang, "Intrinsic stability of a body hovering in an oscillating airflow," Physical Review Letters, vol. 108, No. 6, p. 068103, 2012.
Karpelson et al., "A wirelessly powered, biologically inspired ambulatory microrobot," in 2014 IEEE International Conference on Robotics and Automation (ICRA), May 2014, pp. 2384-2391.
Balasubramanian, et al., "An insect-sized robot that uses a custom-built onboard camera and a neural network to classify and respond to visual input," in Biomedical Robotics and Biomechatronics (BioRob), 2018 IEEE.
C. P. Ellington, "The aerodynamics of hovering insect flight, vi. lift and power requirements," Phil. Trans. R. Soc. Lond. B, vol. 305, No. 1122, pp. 145-181, 1984.
Chukewad, Y. et al., "A New Robot Fly Design That is Easier to Fabricate and Capable of Flight and Ground Locomotion," IEEE, Oct. 1-5, 2018, 8 pages.
Dougherty et al., "A 10 V Fully-Integrated Switched-Mode Step-up Piezo Drive Stage in 0.13 µm CMOS Using Nested-Bootstrapped Switch Cells," IEEE Journal of Solid-State Circuits (2016).
E. Steltz, M. Seeman, S. Avadhanula, and R. S. Fearing, "Power electronics design choice for piezoelectric microrobots," in Intelligent Robots and Systems, 2006 IEEE/RSJ International Conference on. IEEE, 2006, pp. 1322-1328.
F. Li, W. Liu, X. Fu, G. Bonsignori, U. Scarfogliero, C. Stefanini, and P. Dario, "Jumping like an insect: Design and dynamic optimization of a jumping mini robot based on bio-mimetic inspiration," Mechatronics, vol. 22, No. 2, pp. 167-176, 2012.
Croon, G. De, K. De Clercq, R. Ruijsink, B. Remes, and C. De Wagter, "Design, aerodynamics, and vision-based control of the DelFly," International Journal of Micro Air Vehicles, vol. 1, No. 2, pp. 71-97, 2009.
H. Tanaka and I. Shimoyama, "Forward flight of swallowtail butterfly with simple flapping motion." Bioinspiration & biomimetics, vol. 5, No. 2, p. 026003, Jun. 2010.
I. Kroo and P. Kunz, "Development of the mesicopter: A miniature autonomous Yotorcraft," in American Helicopter Society (AHS) Vertical Lift Aircraft Design Conference, San Francisco, CA, 2000.
International Preliminary Report on Patentability dated Nov. 26, 2020 in International Application No. PCT/US2019/031871, 11 pages.
International Search Report and Written Opinion dated Sep. 24, 2019 in International Application No. PCT/US19/31871, 14 pages.
J. P. Whitney, P. S. Sreetharan, K. Y. Ma, and R. J. Wood, "Popup book mems," Journal of Micromechanics and Microengineering, vol. 21, No. 11, p. 115021, 2011.
James, J. et al., "Liftoff of a 190 mg Laser-Powered Aerial Vehicle: The Lightest Wireless Robot to Fly," IEEE, May 21-25, 2018, 8 pages.
K. I. Arai, W. Sugawara, K. Ishiyama, T. Honda, and M. Yamaguchi, "Fabrication of small flying machines using magnetic thin films," IEEE Transactions on Magnetics, vol. 31, No. 6, pp. 3758-3760, Nov. 1995.
K. Peterson and R. S. Fearing, "Experimental dynamics of wing assisted running fora bipedal ornithopter," in Intelligent Robots and Systems (IROS), 2011 IEEE/RSJ International Conference on. IEEE, 2011, pp. 5080-5086.
K. Y. Ma, P. Chirarattananon, S. B. Fuller, and R. J. Wood, "Controlled flight of a biologically inspired, insect-scale robot," Science, vol. 340, No. 6132, pp. 603-607, 2013.
K. Y. Ma, S. M. Felton, and R. J. Wood, "Design, fabrication, and modeling of the split actuator microrobotic bee," in Intelligent Robots and Systems (IROS), 2012 IEEE/RSJ International Conference on. IEEE, 2012, pp. 1133-1140.
L. Daler, S. Mintchev, C. Stefanini, and D. Floreano, "A bioinspired multi-modal flying and walking robot," Bioinspiration & biomimetics, vol. 10, No. 1, p. 016005, 2015.
L. Ristroph and S. Childress, "Stable hovering of a jellyfish-like flying machine," Journal of The Royal Society Interface, No. 92, 2014.
M. Bryant, E. Wolff, and E. Garcia, "Aeroelastic flutter energy harvester design: the sensitivity of the driving instability to system parameters," Smart Materials and Structures, vol. 20, No. 12, p. 125017, 2011.
M. Graule, P. Chirarattananon, S. Fuller, N. Jafferis, K. Ma, M. Spenko, R. Kornbluh, and R. Wood, "Perching and takeoff of a robotic insect on overhangs using switchable electrostatic adhesion," Science, vol. 352, No. 6288, pp. 978-982, 2016.

(56) References Cited

OTHER PUBLICATIONS

M. H. Dickinson and K. G. Gotz, "Unsteady aerodynamic performance of model wings at low reynolds numbers," Journal of Experimental Biology, vol. 174, No. 1, pp. 45-64, 1993.
M. H. Dickinson, F.-O. Lehmann, and S. P. Sane, "Wing rotation and the aerodynamic basis of insect flight," Science, vol. 284, No. 5422, pp. 1954-1960, 1999.
M. Karpelson, G.-Y. Wei, and R. J. Wood, "Driving high voltage piezoelectric actuators in microrobotic applications," Sensors and Actuators A: Physical, vol. 176, pp. 78-89, 2012.
M. Karpelson, G.-Y. Wei, and R. J. Wood, "Milligram-scale high-voltage power electronics for piezoelectric microrobots," in Robotics and Automation, 2009. ICRA'09. IEEE International Conference on. IEEE, 2009, pp. 2217-2224.
M. Keennon, K. Klingebiel, H. Won, and A. Andriukov, "Development of the nano hummingbird: A tailless flapping wing micro air vehicle," in AIAA Aerospace Sciences Meeting. Reston, VA: AIAA, Jan. 9-12, 2012, pp. 1-24.
M. Lok, E. F. Helbling, X. Zhang, R. Wood, D. Brooks, and G. Y. Wei, "A low mass power electronics unit to drive piezoelectric actuators for flying microrobots," IEEE Transactions on Power Electronics, vol. 33, No. 4, pp. 3180-3191, 2018.
M. Perales, M.-h. Yang, C.-I. Wu, C.-w. Hsu, W.-s. Chao, K.-h. Chen, and T. Zahuranec, "Characterization of high performance silicon-based vmj pv cells for laser power transmission applications," in Proc. of SPIE Vol, vol. 9733, 2016, pp. 97 330U-1.
M. Piccoli and M. Yim, "Piccolissimo: The smallest micro aerial vehicle," in Robotics and Automation (ICRA), 2017 IEEE International Conference on. IEEE, 2017, pp. 3328-3333.
N. T. Jafferis, M. A. Graule, and R. J. Wood, "Non-linear resonance modeling and system design improvements for underactuated flapping-wing vehicles," in 2016 IEEE International Conference on Robotics and Automation (ICRA). IEEE, 2016, pp. 3234-3241.
NASA, "Beamed Laser Power for UAVs," 2004.
Nugent et al., "12 Hour Hover: Flight Demonstration of a Laser-powered Quadrocoptor," LaserMotive white paper (2011), archived at https://web.archive.org/web/20170120184045/http://lasermotive.com/wp-content/uploads/2010/04/AUVSI-white-paper-8-11.pdf.
Nugent et al., "Laser power for UAVs," LaserMotive white paper (2010), archived at https://web.archive.org/web/20170120184045/http://lasermotive.com/wp-content/uploads/2010/04/Wireless-Power-for-UAVs-March2010.pdf.
P. Chirarattananon and R. J. Wood, "Identification of flight aerodynamics for flapping-wing microrobots," in Robotics and Automation (ICRA), 2013 IEEE International Conference on. IEEE, 2013, pp. 1389-1396.
P. Chirarattananon, K. Y. Ma, and R. J. Wood, "Adaptive control for takeoff, hovering, and Tanding of a robotic fly," in Intelligent Robots and Systems (IROS), 2013 IEEE/RSJ International Conference on. IEEE, 2013, pp. 3808-3815.
P. S. Sreetharan, J. P. Whitney, M. D. Strauss, and R. J. Wood, "Monolithic fabrication of millimeter-scale machines," Journal of Micromechanics and Microengineering, vol. 22, No. 5, p. 055027, 2012.
R. A. Brooks and A. M. Flynn, "Fast, cheap, and out of control: A robot invasion of the solar system," Journal of the British Interplanetary Society, vol. 42, pp. 478-485, 1989.
R. Fearing, K. Chiang, M. Dickinson, D. Pick, M. Sitti, and J. Yan, "Wing transmission fora micromechanical flying insect," in Robotics and Automation (ICRA), 2000 IEEE Int. Conf. IEEE, 2000.
R. J. Bachmann, F. J. Boria, R. Vaidyanathan, p. G. Ifju, and R. D. Quinn, "A biologically inspired micro-vehicle capable of aerial and terrestrial locomotion," Mechanism and Machine Theory, vol. 44, No. 3, pp. 513-526, 2009.
R. J. Wood, "The first takeoff of a biologically inspired at-scale robotic insect," IEEE Trans. Robotics, vol. 24, No. 2, pp. 341-347, 2008.
R. J. Wood, B. Finio, M. Karpelson, K. Ma, N. O. Pe 'rez-Arancibia, P. S. Sreetharan, H. Tanaka, and J. P. Whitney, "Progress on "pico" air vehicles," Int. J. Robotics Research, No. 11, 2012.
Excerpts from R. M. Alexander, Principles of animal locomotion. Excerpts include Preface, Chapters One, Two, Ten, Eleven, and Twelve. Princeton University Press, 2003, 104 pages.
S. B. Fuller, M. Karpelson, A. Censi, K. Y. Ma, and R. J. Wood, "Controlling free flight of a Yobotic fly using an onboard vision sensor inspired by insect ocelli," Journal of The Royal Society Interface, vol. 11, No. 97, p. 20140281, 2014.
S. Chaput, M. Renaud, R. Meingan, and J. F. Pratte, "A 3.7 v to 200 v highly integrated dc-dc converter with 70.4mems applications," in 2014 IEEE 12th International New Circuits and Systems Conference (NEWCAS), Jun. 2014, pp. 381-384.
S. I. Inc., "Low esr, low leak current chip-type edlc cpx3225a752d," 2016. [Online], Available: http://www.sii.co.jp/en/me/datasheets/chip- capacitor/cpx3225a752d/.
T. J. Nugent, Jr. and J. T. Kare, "Laser power beaming for defense and security applications," pp. 804 514-804 514-8, 2011. [Online], Available: http://dx.doi.org/10.1117/12.886169.
V. Iyer, E. Bayati, R. Nandakumar, A. Majumdar, and S. Gollakota, "Charging a smartphone across a room using lasers," IMWUT 2017.
V. Talia, B. Kellogg, B. Ransford, S. Naderiparizi, S. Gollakota, and J. R. Smith, "Powering the next billion devices with wi-fi," ACM CoNEXT '15.
W. S. N. Trimmer, "Microbots and micromechanical systems," Sensors and Actuators, vol. 19, pp. 267-287, 1989.
Chukewad et al., "A robot fly composed of actuator units folded from a single laminate sheet, capable of ground locomotion, takeoff and landing." in Robotics and Automation (ICRA), IEEE Int. Conf., 2018.
Y. Mulgaonkar, el., "The flying monkey: a mesoscale robot that can run, fly, and grasp," in Robotics and Automation (ICRA), 2016 IEEE International Conference on. IEEE, 2016, pp. 4672-4679.
Y. Zou, W. Zhang, and Z. Zhang, "Liftoff of an electromagnetically driven insect-inspired flapping-wing robot," IEEE Transactions on Robotics, vol. 32, No. 5, pp. 1285-1289, Oct. 2016.
Z. A. Khan and S. K. Agrawal, "Design offlapping mechanisms based on transverse bending phenomena in insects," in Robotics and Automation, 2006. ICRA 2006. Proceedings 2006 IEEE International Conference on. IEEE, 2006, pp. 2323-2328.
Zeng et al., "Communications and Signals Design for Wireless Power Transmission," IEEE Transactions on Communications (2017).

\* cited by examiner

| Component | Weight (mg) |
|---|---|
| Boost Converter & Driver Subtotal | 73.7 |
| Coupled Inductor | 21 |
| MOSFET | 9.2 |
| V$s$Capicitor | 2.6 |
| Diode | 1.5 |
| Driver Transistors | 17.5 |
| C$u$ traces | 6.3 |
| Circuit Substrate | 10.0 |
| Assorted Resistors | 0.4 |
| Solder & Conductors | 3.0 |
| Carbon Fiber Frame | 2.2 |
| MCU Assembly | 17.5 |
| PV Cell & Leads | 13 |
| Robot without PEU | 73 |
| Misc. Glue & Wiring | 13 |
| Total Robot Weight | 190 |

*Fig. 12*

UNTETHERED FLYING MICRO-ROBOTS

CROSS-REFERENCE TO RELATED APPLICATION

The present application is a national stage application under 35 U.S.C. § 371, of International Patent Application No. PCT/US19/31871, filed on May 10, 2019, which claims priority to U.S. Provisional Patent Application No. 62/670,310, filed May 11, 2018, each of which is incorporated herein in its entirety by reference.

TECHNICAL FIELD

The present technology is directed generally to small robots, such as insect-sized robots, which may be referred to as micro-robots. In particular, the present technology is directed to untethered aerial (flying) micro-robots, and associated systems and methods, such as wireless power systems and methods.

BACKGROUND

Micro-robots, such as insect-sized robots weighing less than a gram or having dimensions less than 100 mm or other small sizes, have several potential benefits associated with their diminutive sizes. For example, micro-robots may be useful in environmental monitoring, agricultural support, search and rescue, and other activities in which large robots may be inefficient, less capable, or less effective. Micro-robots may also operate around people with reduced risk of harm from impact relative to larger robots.

Creating an aerial micro-robot presents several challenges. For example, traditional propulsion systems such as propellers or rotors do not provide sufficient propulsion due to physical limitations in scaling propellers, rotors, and motors (such as electromagnetic motors) down to small sizes, especially when implementing such systems in robots smaller than 200 milligrams. Some robots have implemented piezo actuators to provide propulsion by flapping small insect-like wings. But piezo-driven robots require high voltage that sometimes exceeds 200 volts. Generating and controlling the necessary voltage signals has so far required large electronic components with a prohibitive weight relative to the payload capacity of an aerial micro-robot. Accordingly, conventional aerial micro-robots using piezo actuators have been constrained to tethered flight.

Creating an untethered aerial micro-robot presents additional challenges. For example, existing batteries are too heavy and result in a prohibitive weight relative to the payload capacity of an aerial micro-robot. Another challenge is that an untethered aerial micro-robot would need to carry its own digital signal processing equipment to, for example, control the piezo actuator and/or provide sensing functionality.

BRIEF DESCRIPTION OF THE DRAWINGS

Many aspects of the present disclosure can be better understood with reference to the following drawings. The components in the drawings are not necessarily to scale. Instead, emphasis is placed on clearly illustrating the principles of the present disclosure. The same reference number indicates the same element throughout the several views.

FIG. 12 is a table showing example weights of components and assemblies configured in accordance with embodiments of the present technology.

DETAILED DESCRIPTION

Figure 1:
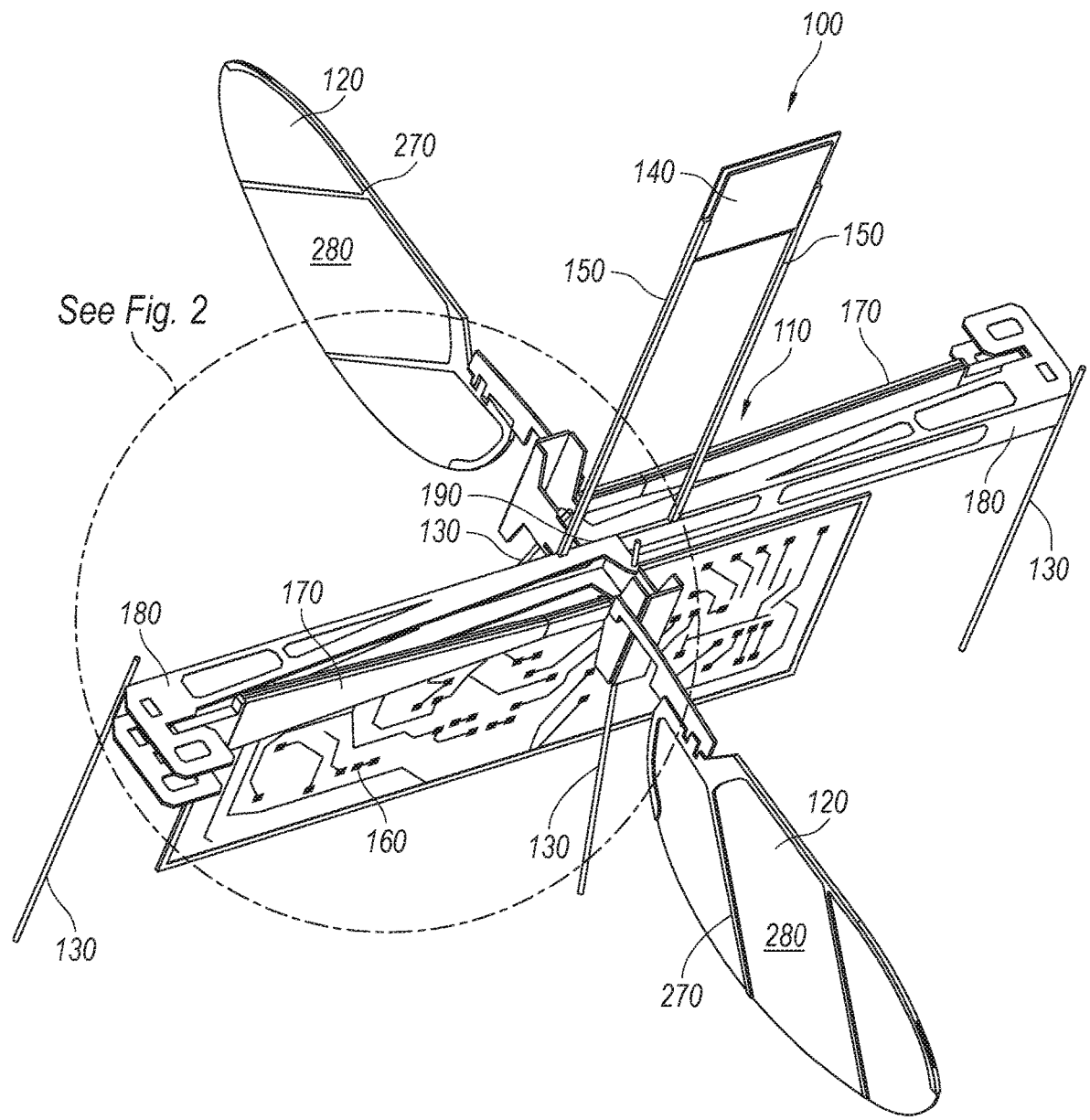
FIG. 1 is an upper perspective view of a robot configured in accordance with embodiments of the present technology.

The present technology is directed generally to untethered lightweight aerial micro-robots carrying (a) a photovoltaic cell that receives light energy (such as from a laser) and converts the light energy to electrical power; (b) a boost converter and signal driver to produce high-voltage alternating voltage signal from the electrical power (such as sinusoidal or other periodic signal); and (c) piezo actuators that flap wings of the micro-robot using the high-voltage periodic alternating signal. The untethered aerial micro-robots disclosed herein weigh less than 200 milligrams and are expected to overcome the challenges that have previously limited micro-robot flight to tethered flight.

In one embodiment of the present technology, for example, an aerial robot system may include an aerial robot having an airframe, a piezo actuator carried by the airframe, a wing carried by the airframe and connected to the piezo actuator, and a photovoltaic cell carried by the airframe. The system may further include a laser source configured to emit a laser beam oriented toward the photovoltaic cell for conversion by the photovoltaic cell into electrical energy. The aerial robot may further include a boost converter connected to the photovoltaic cell and configured to raise a voltage level of the electrical energy, and a signal generator connected to the boost converter and configured to generate an alternating signal (such as a periodic signal). The piezo actuator is connected to the signal generator and configured to actuate the wing to move in a flapping motion, thereby generating aerodynamic force to move the robot along a ground locomotive path or in aerial flight.

In another embodiment of the present technology, a robot system includes a robot having a frame portion and a piezo actuator. The frame portion includes a receiving structure configured to hold a first end of the piezo actuator and a transmission structure having one or more flexure joints. The transmission structure is connected to a second end of the piezo actuator opposite the first end. The robot further includes a wing attached to the transmission structure, a photovoltaic cell connected to the frame portion, and an electronic component assembly operably coupled to the photovoltaic cell and the piezo actuator. The photovoltaic cell is configured to receive light energy and to convert the light energy to electrical energy. The electronic component assembly provides a periodic energy signal to the piezo actuator to cause the wing to oscillate to create aerodynamic force.

In still another embodiment of the present technology, a propulsion system for a robot includes a piezo actuator, a photovoltaic cell for receiving light energy and converting the light energy to electrical energy, a boost converter connected to the photovoltaic cell to receive the electrical energy from the photovoltaic cell and increase a voltage of the electrical energy and output the increased voltage as a biasing voltage signal for the piezo actuator, and a signal driver connected to the boost converter for receiving the biasing voltage signal and outputting an alternating voltage signal for the piezo actuator. The piezo actuator receives the biasing voltage signal and oscillates according to the alternating voltage signal.

In yet another embodiment of the present technology, a method for manufacturing an electronics system for an aerial robot includes positioning a layer of copper on a base adhesive, cutting the copper using a laser to form copper traces for connecting electronic components, positioning a layer of polymer film on the copper traces, removing the base adhesive from the copper traces, and positioning one or more electronic components on the copper traces.

Various embodiments of the technology are described herein. The following description provides specific details for a thorough understanding and an enabling description of these embodiments. One skilled in the art will understand, however, that the technology may be practiced without many of these details. Additionally, some well-known structures or functions, such as those associated with piezoelectric actuators, electronic circuitry, and laser systems, may not be shown or described in detail for efficiency and to avoid unnecessarily obscuring the relevant description of the various embodiments. Accordingly, the technology may include other embodiments with additional elements or without several of the elements described below with reference to FIGS. 1-13.

The terminology used in the description presented below is intended to be interpreted in its broadest reasonable manner, even though it is being used in conjunction with a detailed description of certain specific embodiments of the technology. Certain terms may even be emphasized below; however, any terminology intended to be interpreted in any restrictive manner will be overtly and specifically defined as such in this detailed description section.

Specific details of several embodiments of the present technology are described herein with reference to untethered aerial micro-robots. The technology may also be implemented in other applications, including, for example, tethered aerial micro-robots, non-flying (non-aerial) micro-robots (such as ground robots with wheels or tracks, or aquatic robots, or other robots), or robots of various sizes smaller and larger than robots described herein.

The following discussion provides a general description of a suitable environment in which the present technology may be implemented. Although not required, aspects of the technology are described in the general context of computer- or controller-executable instructions, such as routines executed by a general-purpose computer. Aspects of the technology can be embodied in a special purpose computer or data processor that is specifically programmed, configured, or constructed to perform one or more of the computer-executable instructions explained in detail herein. Aspects of the technology can also be practiced in distributed computing environments where tasks or modules are performed by remote processing devices, which are linked through a communication network (e.g., a wireless communication network, a wired communication network, a cellular communication network, the Internet, and/or a short-range radio network (e.g., via Bluetooth). In a distributed computing environment, program modules may be located in both local and remote memory storage devices.

Computer-implemented instructions, data structures, screen displays, and other data under aspects of the technology may be stored or distributed on computer-readable storage media, including magnetically or optically readable computer disks, as microcode on semiconductor memory, nanotechnology memory, organic or optical memory, or other portable and/or non-transitory data storage media. In some embodiments, aspects of the technology may be distributed over the Internet or over other networks (e.g. a Bluetooth network) on a propagated signal on a propagation medium (e.g., an electromagnetic wave(s) or a sound wave) over a period of time, or may be provided on any analog or digital network (e.g., packet switched, circuit switched, or other scheme).

A. Embodiments of Aerial Micro-Robots

FIG. 1 is an upper perspective view of a robot 100 configured in accordance with embodiments of the present technology. In some embodiments, the robot 100 may be an aerial robot (sometimes referred to as a "UAV" or "unmanned aerial vehicle" or "drone") including a structural frame, such as an airframe 110, one or more wings 120, and one or more (e.g., four) optional support legs 130 positioned to support the robot 100 on a surface (not shown) before and after flight operations. In operation, the robot 100 moves its wings 120 to generate aerodynamic forces and lift for ground locomotion, take-off, flight, and landing. The wings 120 may be structurally similar to insect wings, and their movement may approximate the movement of insect wings, such as a flapping motion, as described in additional detail below.

The robot 100 may include a photovoltaic cell 140 carried by the airframe 110 and configured to convert light energy into electricity. In some embodiments, for example, the photovoltaic cell 140 may be supported on the airframe 110 by one or more support elements 150, which may hold the photovoltaic cell 140 above the airframe 110 by a selected distance (e.g., approximately 20 millimeters) and orientation suitable for providing direct line-of-sight to a remote light energy source (e.g., a laser beam). In some embodiments, the photovoltaic cell 140 may be positioned on the airframe 110 or otherwise supported by or on the airframe 110 in other positions. The photovoltaic cell 140 may be positioned and configured to receive light energy, such as a laser beam, from the remote source. In some embodiments, the photovoltaic cell 140 is configured to collect energy from a single wavelength and at high power densities, such as power densities of approximately 75 Watts per square meter, although in other embodiments, it may collect multiple wavelengths at any suitable power densities. In some embodiments, lower power density light energy sources may be used to reduce risk of eye injury. In such embodiments, larger photovoltaic cells 140 or arrays of photovoltaic cells 140 may be used. In some embodiments, a vertical multi-junction photovoltaic cell may be used (such as, for example, a MH GoPower model 5S0303.4). In a particular embodiment, the photovoltaic cell 140 may include serially interconnected p-n junctions bonded together to form a small photovoltaic array with low series resistance that are expected to perform well under the intensity levels of light used to power the robot 100. In a particular embodiment, the photovoltaic cell 140 measures 2.88 millimeters by 2.95 millimeters and weighs approximately 8 milligrams, with an additional 5 milligrams of wiring. In other embodiments, however, the cell 140 may have other suitable sizes. Laser energy for powering the robot 100 is described in additional detail below.

The robot 100 may further include an electronics system 160 carried by the airframe 110 to perform onboard power supply functions and onboard computation and control. As described in additional detail below, the electronics system 160 may include a boost converter connected to the photovoltaic cell to raise a voltage level of electrical energy generated by the photovoltaic cell from the laser beam (or other suitable light source). The electronics system 160 may further include a signal generator connected to the boost converter to generate an alternating signal (such as a periodic signal) for driving one or more piezo actuators 170 carried by the airframe 110 and connected to the wings 120. In the illustrated embodiment, for example, the robot 100 includes a piezo actuator 170 operably coupled to each of the two wings 120. Each piezo actuator 170 is configured to actuate a wing 120 to move in a flapping motion. The electronics system 160 may further include a controller programmed with instructions that, when executed, cause the boost converter to raise the voltage level of the electrical energy from the photovoltaic cell and to cause the signal generator to generate the periodic signal. The electronics system 160 may be in the form of a printed circuit board carrying the electronic components, and/or it may include another suitable arrangement of the constituent components in an electronic component assembly.

One or more of the piezo actuators 170 may include a bimorph piezo actuator configured to deform in two directions relative to a resting position when electrical energy is applied. For example, as described in additional detail below, the alternating signal may include a sinusoidal signal to oscillate the piezo actuators 170 (independently or together), which in turn cause the flapping motion of the wings 120. In some embodiments, other piezo actuators may be used. In some embodiments, the photovoltaic cell 140 may be part of, or carried on, the electronics system 160 supported beneath the airframe 110.

In some embodiments, the airframe 110 may be formed with one or more frame portions 180. In the embodiment shown in FIG. 1, for example, the airframe 110 is composed of two frame portions 180 that are generally similar to each other and attached together (such as glued or otherwise fastened together) at an interface 190. In other embodiments, however, the airframe 110 may have a different number of frame portions 180 and/or the frame portions 180 may have a different arrangement relative to each other.

Figure 2:
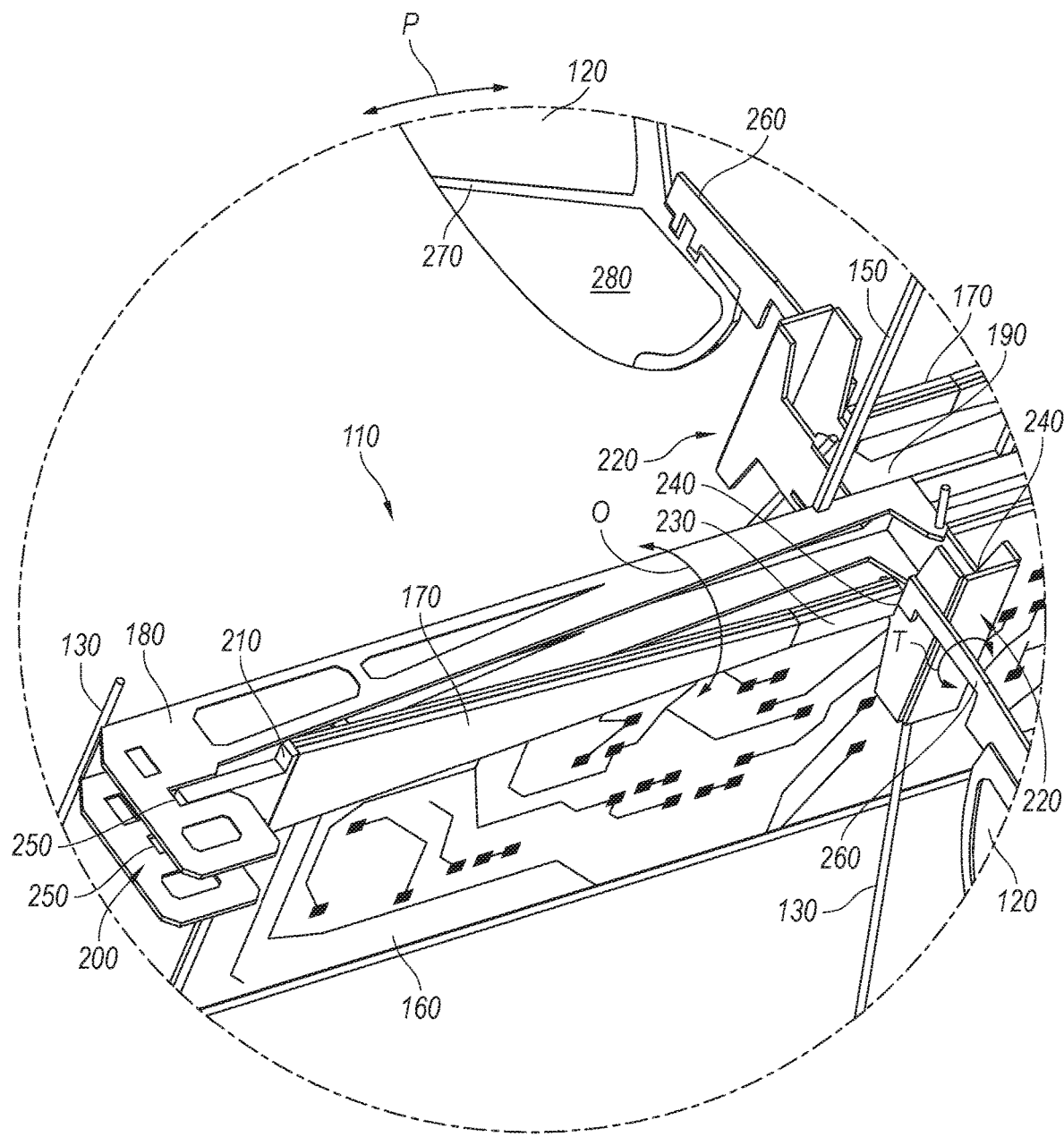
FIG. 2 is a detailed view of a portion of the robot of FIG. 1.

FIG. 2 is a detailed view of a portion of the robot 100 of FIG. 1, as indicated by the dashed outline shown in FIG. 1.

As best seen in FIG. 2, in some embodiments, the frame portion 180 may include a receiving structure 200 configured to hold a first end 210 of one of the piezo actuators 170. The frame portion 180 may further include a transmission structure 220 connected to a second end 230 of the piezo actuator 170 opposite the first end 210 of the piezo actuator 170. Accordingly, the piezo actuators 170 may span along all or part of a length of their respective frame portions 180. In some embodiments, the transmission structure 220 includes one or more flexure joints 240 configured to amplify oscillating movement of the piezo actuator 170 (and thereby amplify movement of the wings 120). The flexure joints 240 are described in additional detail below. In some embodiments, a transmission structure 220 may be omitted and the piezo actuator 170 may directly drive the wing 120. In some embodiments, the receiving structure 200 may include one or more slots 250 to hold the piezo actuator 170.

In some embodiments, each wing 120 is connected to the transmission structure 220 or the piezo actuator 170 via a torsional spring element 260. The torsional spring element 260 may be a torsionally resilient element that includes any shape and/or material suitable for facilitating resilient twisting and/or rotating of wing 120 relative to the transmission structure 220 or the piezo actuator 170. In some embodiments, the torsional spring element 260 may be positioned and oriented to extend along a direction that is generally transverse to the frame portion 180. As the piezo actuator 170 moves according to its alternating (e.g., periodic, sinusoidal) power input, the piezo actuator 170 moves the wing 120 via the optional transmission structure 220 along a rotational and/or pivoting path P that resembles flapping of an insect wing. In some embodiments, the torsional spring element 260 facilitates torsion of the wing 120 about the torsional spring element 260 (such as along a path T) to further facilitate the movement of the wing 120 in a manner that resembles flapping of an insect wing.

Referring to FIGS. 1 and 2 together, in some embodiments each wing 120 may include a wing skeleton 270 that carries an attached wing film 280, which may include a sheet of material. In some embodiments, the wing film 280 may include a polyester material (such as polyester terephthalate) or other suitable materials. In some embodiments, the wing skeleton 270 may be formed with one or more composite materials, such as unidirectional carbon fiber composite in an epoxy resin binder, or other composite materials suitable for providing lightweight structural support.

Figure 3:
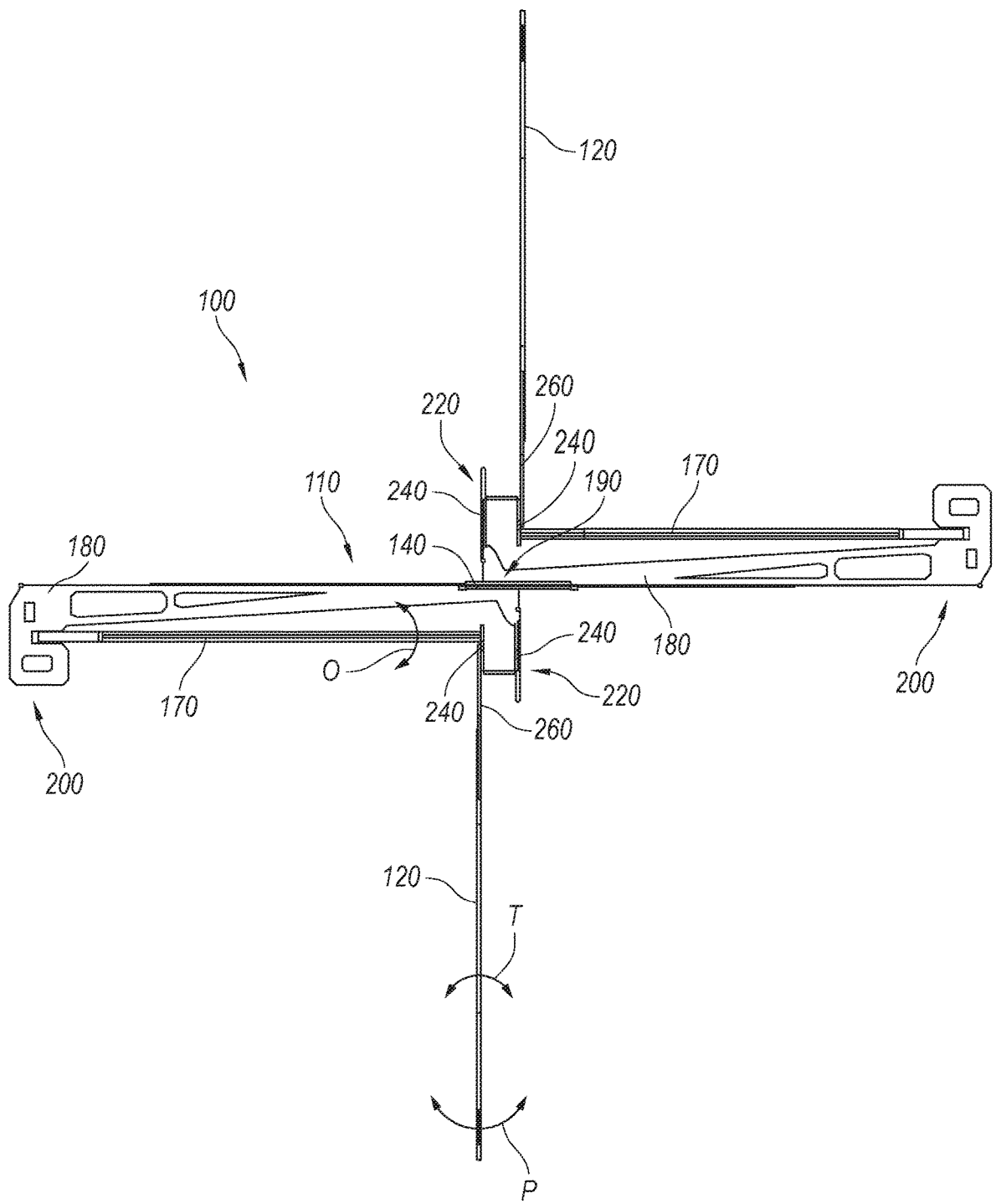
FIG. 3 is a top view of the robot shown in FIGS. 1 and 2.

FIG. 3 is a top view of the robot 100 shown and described above with respect to FIGS. 1 and 2. As best seen in FIG. 3, in some embodiments the robot 100 may be assembled by individually manufacturing a first frame portion 180, manufacturing a second frame portion 180, joining the frame portions 180 at the interface 190, and attaching components of the robot 100.

In operation, the piezo actuator 170 oscillates along path O (toward and away from a frame portion 180), which causes the wing 120 to oscillate along path P via the transmission structure 220, while aerodynamic and inertial forces on the wing 120 cause the wing 120 to twist about path T (due to the torsional spring element 260), which changes the angle of attack of the wing 120 as it sweeps along path P.

Figure 4A:
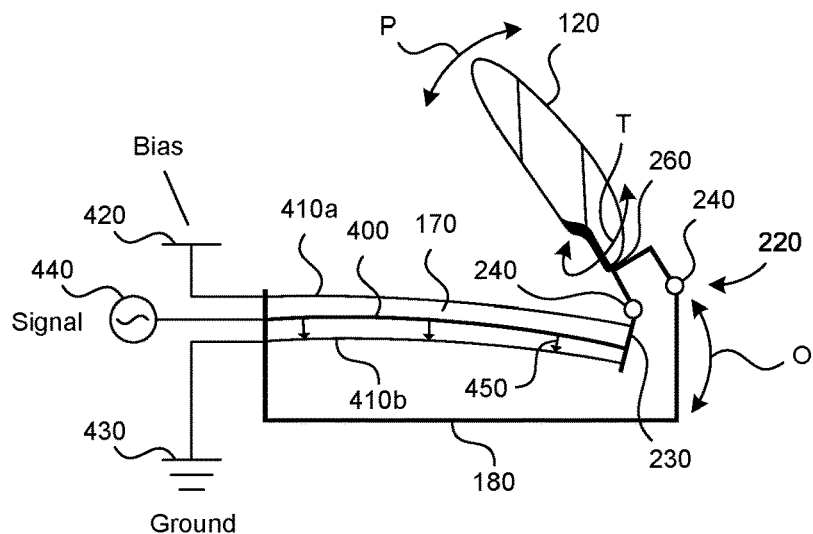
FIGS. 4A, 4B, and 4C are top schematic views of a portion of the robot shown in FIGS. 1-3 illustrating the robot in operation.
Figure 4B:
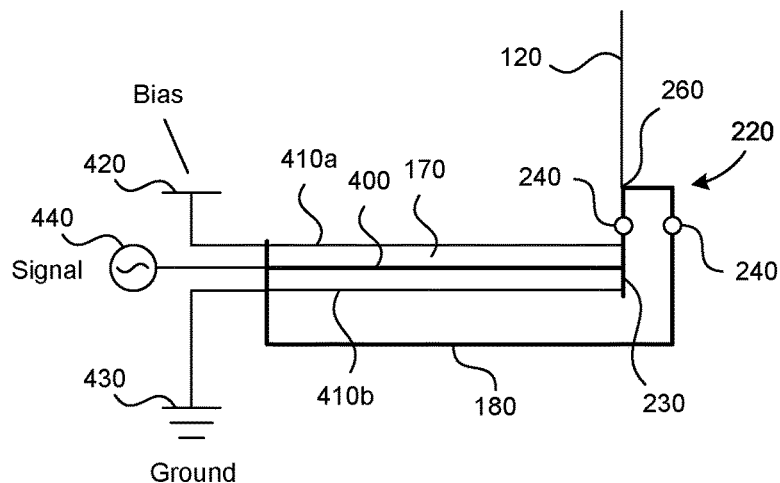
Figure 4C:
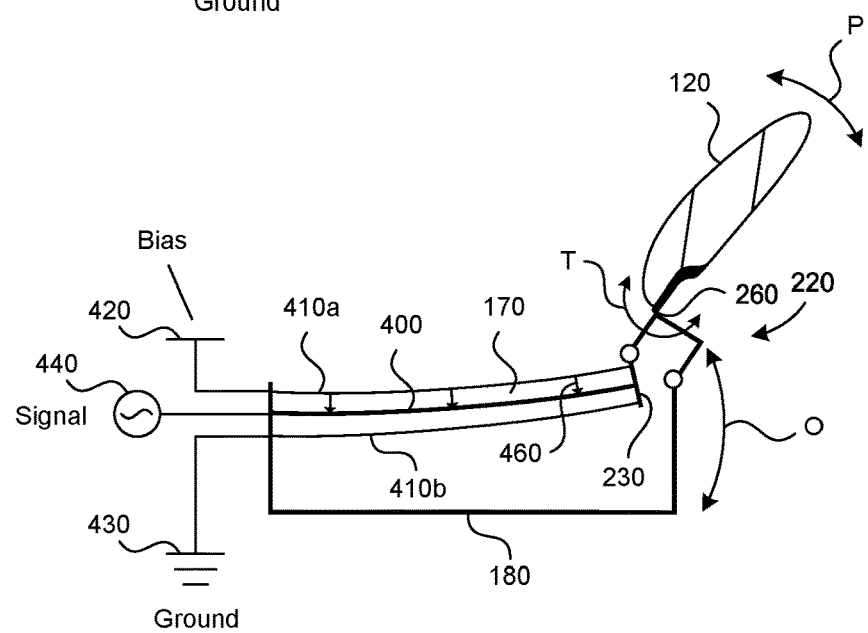

FIGS. 4A, 4B, and 4C are top schematic views of a portion of the robot 100 shown in FIGS. 1-3 illustrating the robot 100 in operation. Referring first to FIG. 4A, the piezo actuator 170 drives large amplitude motion of the wing 120 through strain changes amplified by the transmission structure 220. In some embodiments, the piezo actuator 170 may be a bimorph piezo actuator including a carbon fiber layer 400 positioned between piezo sheets 410a, 410b. In some embodiments, one of the piezo sheets 410a, 410b (such as the piezo sheet 410a closer to the wing 120, or the other piezo sheet 410b) may be charged to a constant voltage by a biasing voltage 420, while the other piezo sheet 410 may be tied to ground 430. An alternating voltage signal 440 (which may be periodic, such as sinusoidal) may be connected to the carbon fiber layer 400 to provide an alternating electric field in the piezo actuator 170, which produces strains that are manifested as motion at the cantilevered second end 230 of the piezo actuator 170. FIGS. 4A and 4C show alternating directions of the electric field as arrows 450 and 460, respectively.

The transmission structure 220, which includes one or more (such as two) spaced-apart and/or opposed flexure joints 240, amplifies the motion of the piezo actuator 170 into larger motions of the wing 120. For example, the piezo actuator 170 is configured to actuate the transmission structure 220 which amplifies the motion of the piezo actuator 170 to oscillate the wing 120 relative to the frame portion 180 between a first position (such as a resting position shown in FIG. 4B, for example) and a second position (shown in FIGS. 4A and 4C, for example) that is at least 40 degrees of rotation away from the first position (such as 45 degrees of operational angle relative to the resting position). Accordingly, in some embodiments, the wing 120 may rotate in an oscillatory manner along path P by 90 degrees. In some embodiments, the transmission structure 220 may be configured to oscillate the wing through other angles. Rotating the wing 120 along path P and facilitating twisting the wing 120 along path T (as described above, using the torsional spring element 260) causes airflow downward (such as into the page carrying FIGS. 4A, 4B, and 4C).

Figure 5:
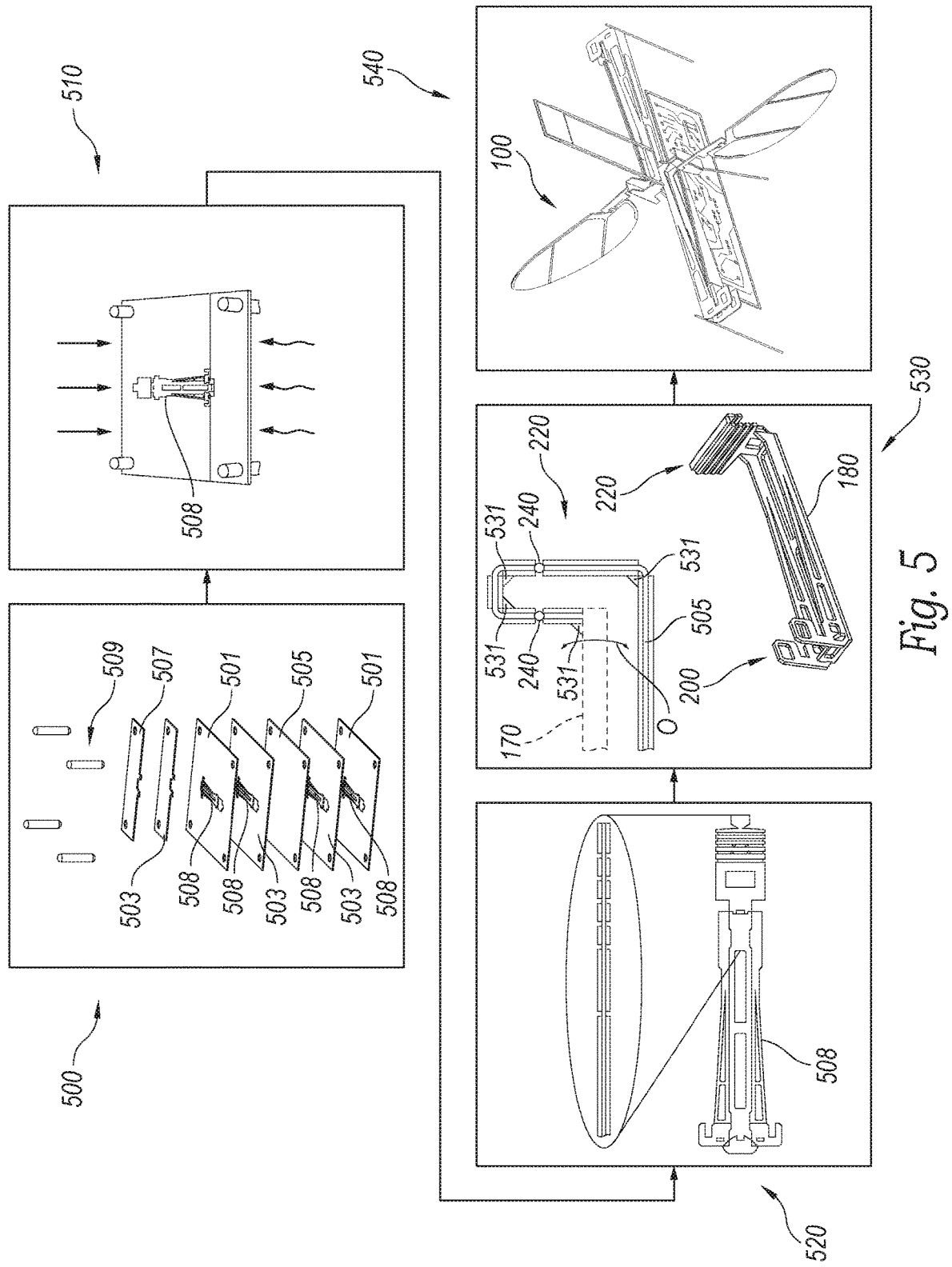
FIG. 5 is a process view of a method for manufacturing a robot configured in accordance with embodiments of the present technology.

FIG. 5 is a process view of a method for manufacturing a robot configured in accordance with embodiments of the present technology, such as the robot 100 illustrated and described above with regard to FIGS. 1-4C. Although a frame portion 180 may be formed with multiple components joined together (such as the receiving structure 200, the transmission structure 220, and other structure to form the frame portion 180), in some embodiments, the frame portion 180 may be formed as a single-piece, integral structure. Forming the frame portion 180 as an integral composite laminate structure is expected to yield a lightweight structure that assists with achieving untethered flight. Forming the frame portion 180 as an integral composite laminate structure is also expected to simplify the fabrication process.

In some embodiments, as generally illustrated in block 500, alternating layers of material may be stacked together to form a laminate structure. For example, alternating layers of carbon fiber 501 (or another suitable composite fiber material), adhesive 503 (such as acrylic bonding ply sold under the trademark PYRALUX by DuPont), and polymer film 505 (such as a polyimide film sold under the trademark KAPTON by DuPont or another suitable polymer film) may be stacked together. In some embodiments, a layer of glass-reinforced epoxy material 507, such as FR-4, may be included. In some embodiments, a cutout 508 in the shape of a flattened frame portion 180 may be formed in one or more of the layers (for example, using a laser cutter). For example, in some embodiments, a polymer film layer 505 may not include a cutout. The cutout 508 defines the features of the frame portion 180, including the receiving structure 200 and the transmission structure 220. In some embodiments, alignment pins 509 may be positioned to pass through one or more of the layers to assist with alignment during a curing process. In other embodiments, however, other suitable materials may be utilized to form the laminate structure used to create the frame portion 180.

In block 510, the stack of layers of material (formed in block 500) is cured with heat and pressure, for example, between 200 and 1000 degrees Celsius at 70 pounds-per-square-inch, or other values of heat and pressure suitable to cure a composite laminate assembly. In block 520, the cutout 508 may be removed from the cured layup created in block 510. Block 520 illustrates top and side views of representative layering of the cutout 508. In block 530, the cutout 508 is folded to form the frame portion 180, including the receiving structure 200 and the transmission structure 220. In some embodiments, adhesive 531 (such as cyanoacrylate adhesive) may be positioned to hold the frame portion 180 in shape, such as the transmission structure 220. Block 530 illustrates side and perspective views of a folded frame portion 180. In some embodiments, the transmission structure 220 may include flexure joints 240 formed as castellated folds spaced apart from each other and connected to each other by rigid structure.

In block 540, the remainder of the robot may be assembled. For example, referring back to FIGS. 1-3, a wing 120 may be attached to the transmission structure 220, optionally via the torsional spring element 260. The combined wing 120 and frame portion 180 may be fixed (such as glued) to another frame portion 180 with a wing 120, at the interface 190. Support legs 130 (such as carbon fiber rods) may be added to the assembly, such as at a static portion of the transmission structure 120 and the far ends of each frame portion 180. Electronic components may then be added and connected. In some embodiments, the airframe 110 may be formed as a single-piece integral structure rather than two frame portions 180, using techniques described herein.

Figure 6:
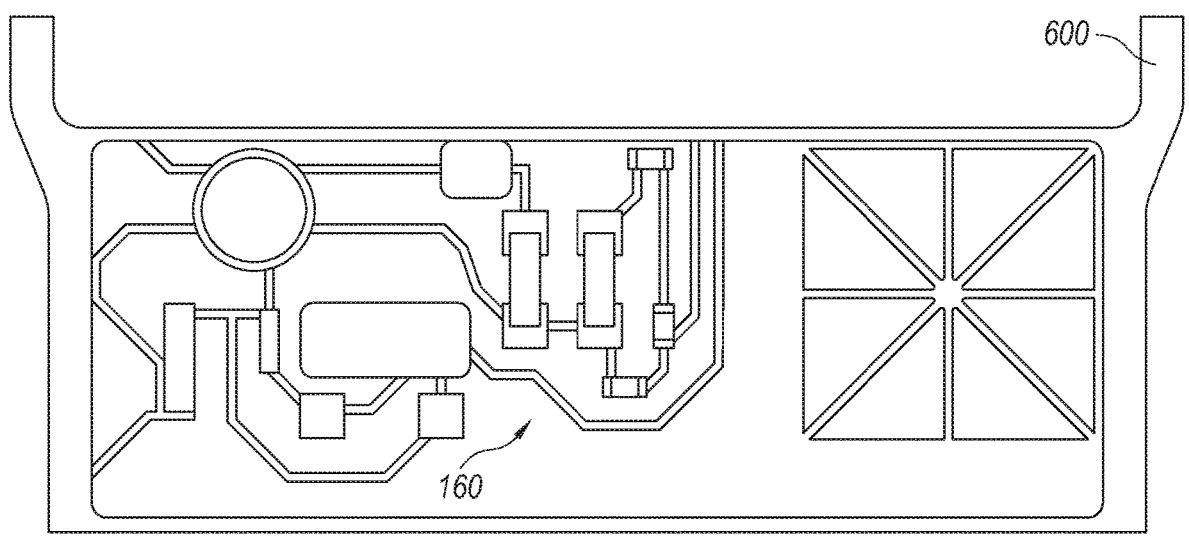
FIG. 6 is a front view of a carriage frame for supporting an electronics system beneath an airframe of the robot of FIG. 1, configured in accordance with embodiments of the present technology.

FIG. 6 is a front view of a carriage frame 600 for supporting the electronics system 160 beneath the airframe 110, in accordance with embodiments of the present technology. For example, FIGS. 1-3 illustrate the electronics system 160 being carried by the airframe 110 beneath the airframe 110. In some embodiments, as illustrated in FIG. 6, the electronics system 160 may be carried in a carriage frame 600 that is attached to and carried by the airframe 110, such as suspended beneath the airframe 110. The carriage frame 600 may be formed with lightweight composite laminate materials, or other suitable lightweight materials.

In some embodiments, by orienting the piezo actuators 170 horizontally (e.g., transverse to the support legs 130) and positioning the carriage frame 600 and/or electronics system 160 beneath the piezo actuators 170 and the airframe 110, the robot 100 has improved stability relative to other design configurations.

B. Electronics System Components and Fabrication

Figure 7:
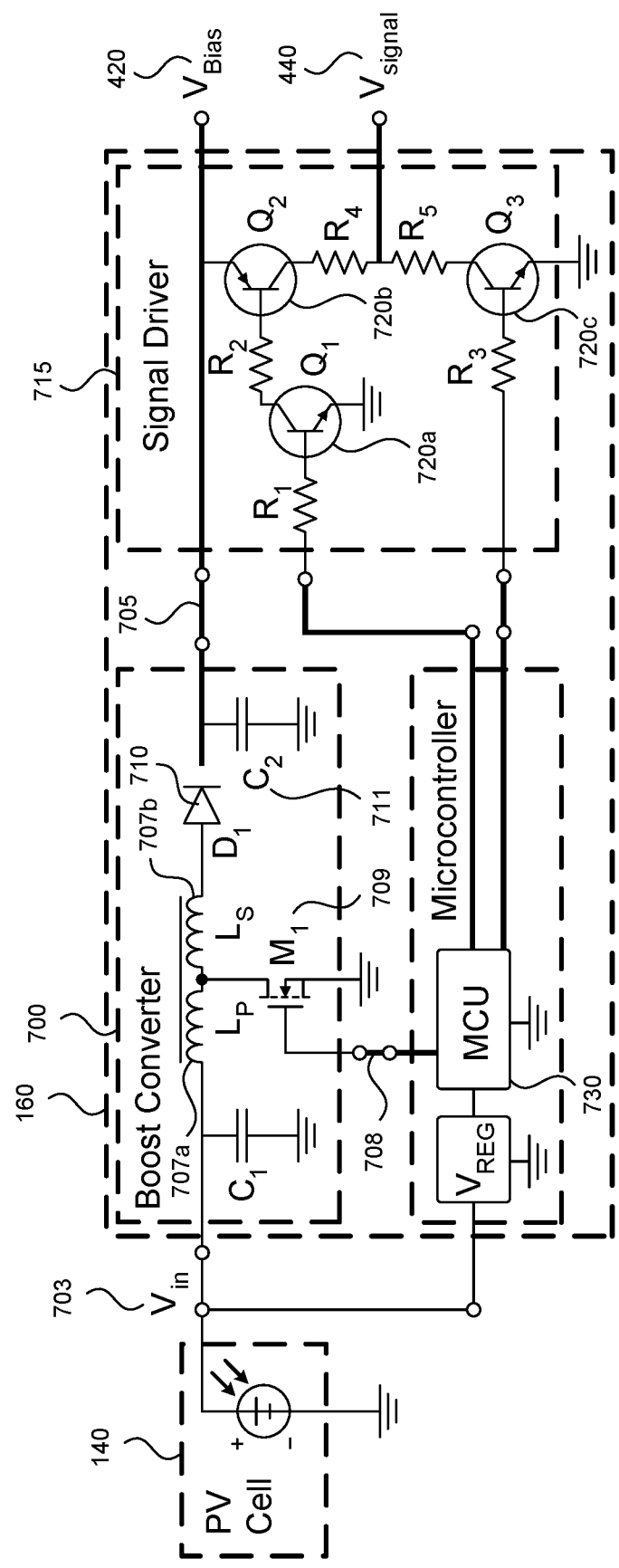
FIG. 7 is a schematic view of an electronics system connected to a photovoltaic cell and configured in accordance with embodiments of the present technology.

Embodiments of the present technology include electronics components and assemblies for providing power to move the piezo actuators. FIG. 7, for example, illustrates a schematic view of the electronics system 160, powered by the connected photovoltaic cell 140, configured in accordance with embodiments of the present technology. The electronics system 160 may include a boost converter 700, a signal driver 715, and a microcontroller 730 (such as a commercially-available ARM STM32F051), which may be operably coupled to one another. The electronics system 160, photovoltaic cell 140, and piezo actuators 170 together define at least part of a propulsion system for lightweight aerial robots, such as the robot 100 described above. The propulsion system may further include other components, such as wings and transmission structures described above.

The photovoltaic cell 140 is configured to receive light (such as laser light, described in additional detail below) and convert the light to electrical energy. To provide a relatively high biasing voltage 420 to a piezo actuator (see FIGS. 4A-4C), the electronics system 160 may include the boost converter 700, which receives voltage input 703 from the photovoltaic cell 140 and outputs increased voltage 705 (at the expense of reduced current) relative to the input voltage 703. The increased voltage 705 is the biasing voltage 420 provided to the piezo actuator (see FIGS. 4A-4C). In some embodiments, the boost converter 700 switches electrical current through a coupled inductor (which includes two inductors 707a, 707b).

In operation, the microcontroller 730 generates a pulse width modulation (PWM) signal 708 that is connected to the gate of a MOSFET 709. The frequency of the PWM signal may be selected to generate a sufficiently smooth sinusoid with adequate PWM resolution without excessively high internal oscillator frequency that results in excessive power consumption. Current through the primary winding 707a stores energy in a magnetic field, which is transferred to the secondary winding 707b. Brief high voltage pulses on the output of the secondary winding 707b, after the MOSFET 709 switches to a nonconducting state, are rectified through a fast diode 710. The output of the fast diode 710 charges a capacitor 711 for storage and output 705 as biasing voltage 420.

In some embodiments, the coupled inductor 707a, 707b includes a high turns ratio at frequencies above 100 kilohertz. In some embodiments, the primary winding 707a includes 43 AWG wire around a ferrite core and the secondary winding 707b includes 46 AWG wire around a ferrite core, a configuration that provides good (e.g., optimum) resistivity, insulation characteristics, and ease of winding. In some embodiments, the coupled inductor 707a, 707b may have a turns ratio of approximately 10:1, or other turns ratios suitable for providing efficient voltage increases. In some embodiments, inductors may be selected to provide reduced voltage requirements on the switching element, relatively low weight of the windings, and good (e.g., optimal) electromagnetic coupling between the windings.

The signal driver 715 generates the alternating voltage signal 440 (which may be a periodic signal such as a sinusoidal signal) provided to the center node of the piezo actuator (see FIGS. 4A-4C). The piezo actuator 170 oscillates as the signal driver 715 sources and sinks current to the center node of the piezo actuator (which may be the carbon fiber layer 400 in FIGS. 4A-4C). The alternating voltage signal 440 varies between 0 volts and the biasing voltage 420 (which may be up to 300 volts in some embodiments).

In operation (and with additional reference to FIGS. 4A-4C), the voltage difference between the biasing voltage 420 and the alternating voltage signal 440, and between the alternating voltage signal 440 and ground causes electrical charge to flow into the layers 410a, 410b of the piezo actuator 170, which results in movement of the piezo actuator 170.

In some embodiments, the signal driver 715 may be in the form of a half-bridge driver. For example, the signal driver 715 may include one or more transistors (such as three transistors) 720a, 720b, 720c which alternatively switch the alternating voltage signal 440 between being connected to the biasing voltage 420 or to ground. Transistors 720a and 720b are configured as a two-stage amplifier designed to source current from the bias rail 420 to implement a high side (e.g., a maximum voltage) of an alternating signal waveform. Transistor 720c generates a low side (e.g., a minimum voltage) of the waveform by sinking current from the center node of each piezo actuator 170 (indicated at signal 440 in FIGS. 4A-4C) to ground.

The timing of the switching events creates a waveform that flaps the wings 120 in the robot 100 with the piezo actuator 170 (see FIGS. 4A-4C) according to the frequency and amplitude of the waveform. In some embodiments, an electronics system 160 may include one signal driver 715 to drive two or more piezo actuators 170. In other embodiments, an electronics system 160 may include a plurality of signal drivers 715 to individually or collectively operate a plurality of piezo actuators 170. For example, each piezo actuator 170 may be connected to its own signal driver 715 for individual control and/or operation of each wing 120.

In some embodiments, the transistors 720 may include bipolar junction transistors because they have increased ability to tolerate the higher voltages necessary to operate the piezo actuators 170 than other transistors while providing a relatively smaller weight and package size than other transistors, and because they include simple gate biasing designs for both linear operation or pulsatile operation.

The microcontroller 730 may be connected to the signal driver 715 to control timing of the switching of the transistors 720a, 720b, 720c. For example, the microcontroller 730 may be programmed with instructions that adjust the waveform that flaps the wings 120. In some embodiments, the microcontroller 730 may include other functions, such as executing instructions to navigate the robot (by manipulating the flapping of the wings 120) or operate an onboard sensor. Generally, the microcontroller 730 controls the boost converter 700 and the signal driver 715. In some embodiments, a lightweight field-programmable gate array (FPGA) may be used in place of, or in addition to, the microcontroller 730. The present technology provides the first insect-scale (e.g., sub-400, or sub-200 milligram) aerial robot with onboard computation to control a boost converter 700 and signal driver 715.

Figure 8:
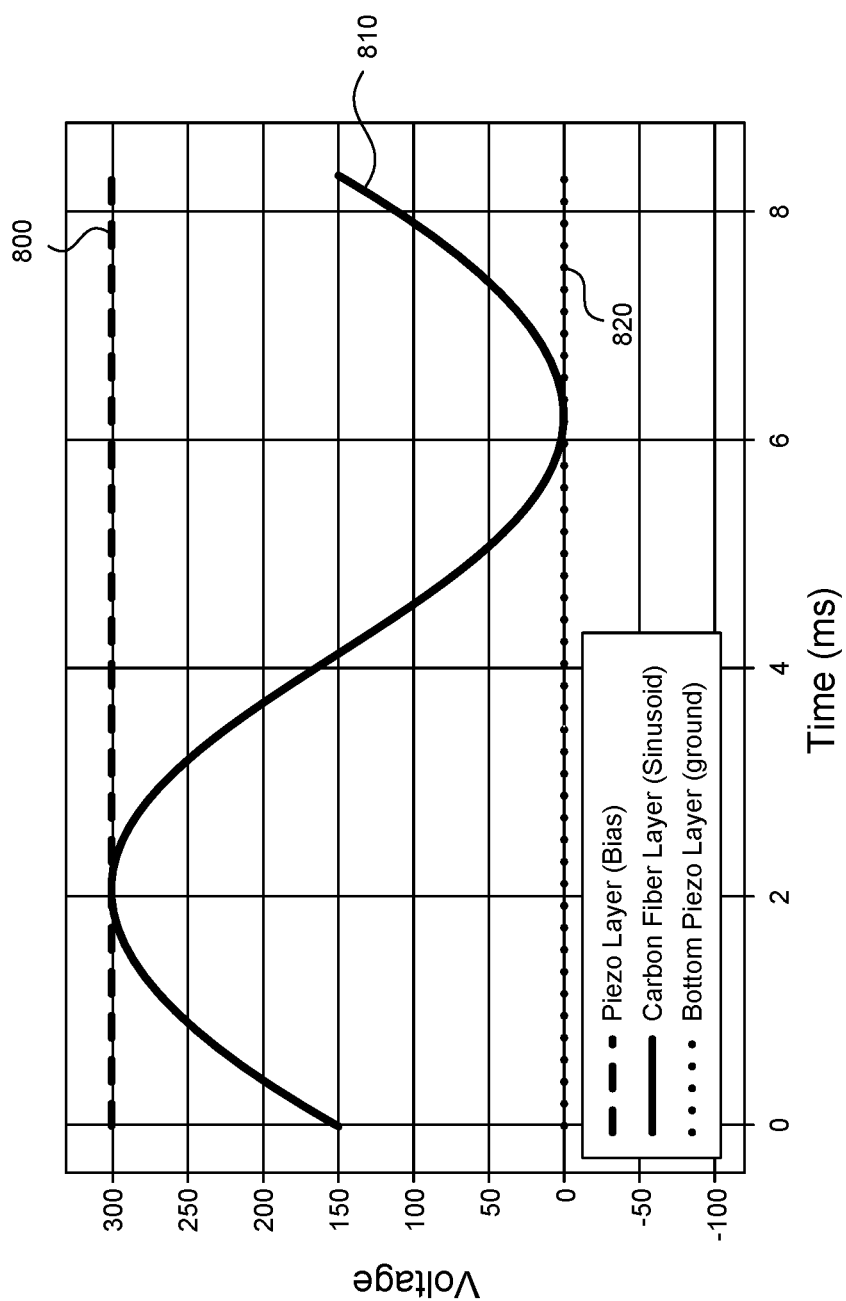
FIG. 8 is a display diagram of example target waveforms for the output of a boost converter and a signal driver configured in accordance with embodiments of the present technology.

FIG. 8 is a display diagram of example target waveforms for the output of a boost converter and a signal driver configured in accordance with embodiments of the present technology. With additional reference to FIGS. 4A, 4B, 4C, and 7, FIG. 8 shows an output voltage waveform 800 of the output voltage 705 from the boost converter 700 (which is equivalent to the biasing voltage 420 input to the piezo sheet 410a closer to the wing). The display diagram of FIG. 8 also shows an alternating voltage waveform 810 of the alternating voltage signal 440 from the signal driver 715, which is applied to the carbon fiber layer 400 of the piezo actuator 170. A ground waveform 820 is also shown in FIG. 8 for reference. Some embodiments of the present technology may also implement a constant and relatively high bias voltage 420 (e.g., 300 volts, although other voltages may be implemented). In some embodiments, a frequency of the waveform generated by the signal driver 715 may be between 120 and 170 hertz (e.g., 120 hertz is shown in FIG. 8), although other frequency ranges may be implemented, such as frequencies that cause the piezo actuator and wing to operate at electrical and mechanical resonance.

Robots configured in accordance with embodiments of the present technology may include energy recovery mechanisms. Recovery of energy from the actuators 170 during the process of driving the output signal toward the alternating waveform 810 can improve the efficiency of the signal driver 715. Such energy recovery systems may entail switching-mode energy conversion schemes involving additional capacitors and/or inductors which restore some portion of the delivered energy back to the boost converter 700 from the actuator 170.

Figure 9A:
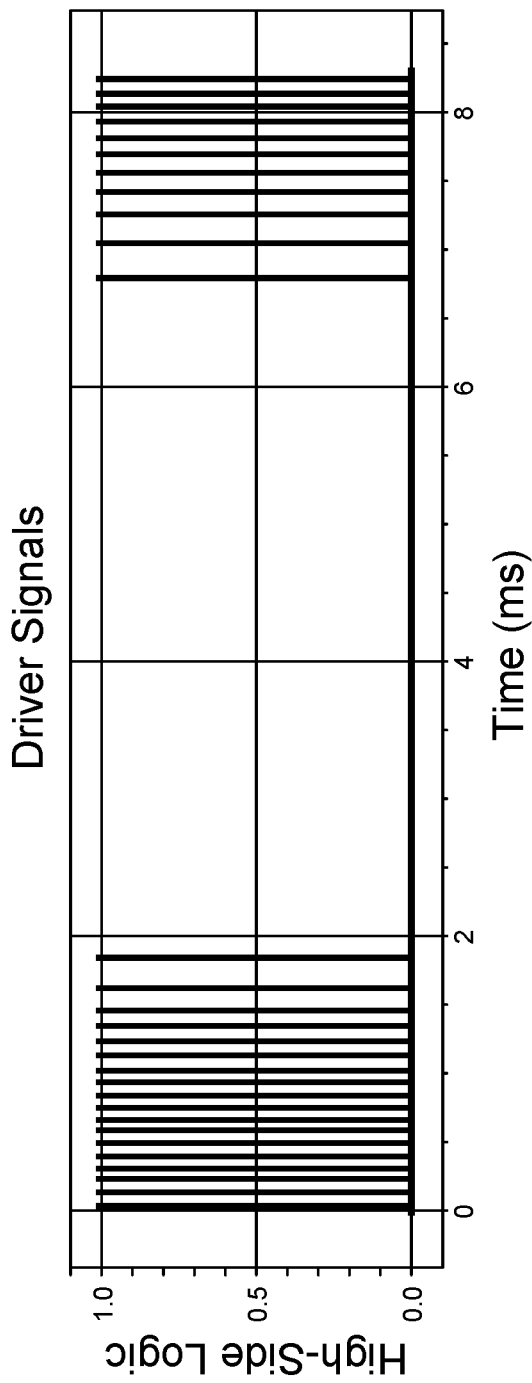
FIGS. 9A and 9B illustrate examples of driver pulse trains varying by pulse frequency used to achieve the alternating voltage waveform shown in FIG. 8.
Figure 9B:
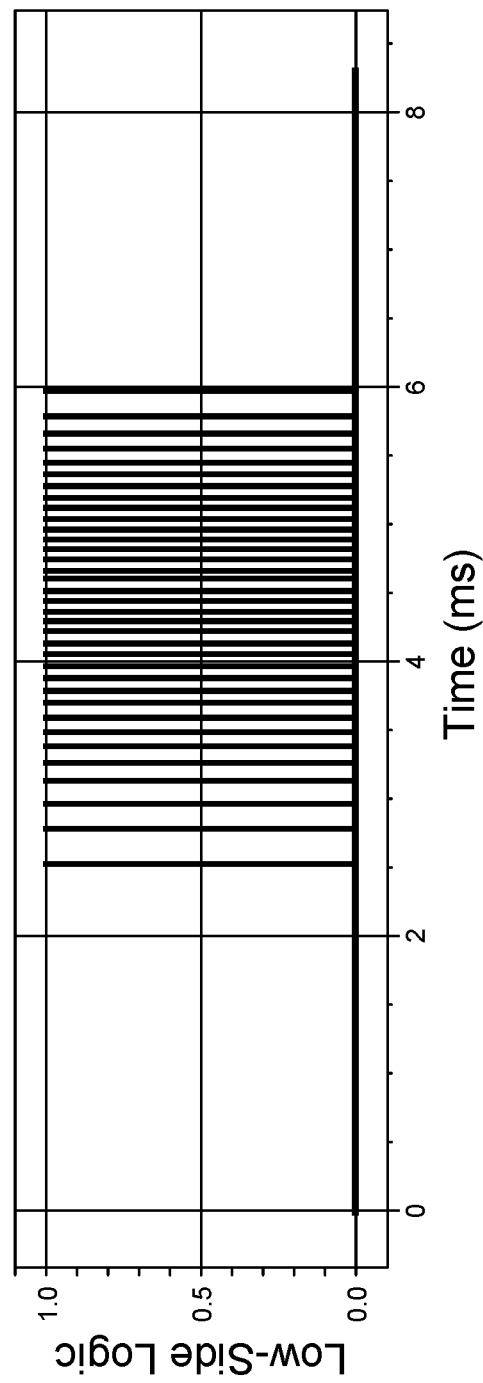

FIGS. 9A and 9B illustrate examples of driver pulse trains varying by pulse frequency used to achieve the alternating voltage waveform 810 shown in FIG. 8. In some embodiments, the microcontroller 730 (see FIG. 7) sends two low-voltage (logic level) signals to the high-side and low-side portions of the signal driver 715 (see FIG. 7) to drive the output voltage of the signal driver 715 towards the alternating voltage waveform 810 (see FIG. 8). The actual alternating voltage waveform 810 (see FIG. 8) may vary depending on factors such as the dynamic load of the robot and conditions of the robot's power supply (such as the photovoltaic cell 140), and other conditions. However, by precomputing the driver pulse trains to drive the high-side and low-side signals that operate the signal driver 715 and using the microcontroller 730 to output the pulse trains, the microcontroller 730 may not need to determine the pulse trains and may operate with reduced power or may have remaining capacity for other data processing work (such as sensors or advanced flight control).

Because displacement (movement) of the piezo actuator 170 depends on the voltage difference between the piezo sheets 410a, 410b and the carbon fiber layer 400 (see FIGS. 4A-4C), in some embodiments it is preferred to maintain a constant high voltage bias (see FIG. 8) while the alternating voltage varies over time. The load of the piezo actuator 170 can vary dynamically during flight and the input power source may be unstable (such as in embodiments in which power is supplied via the photovoltaic cell 140 receiving light such as a laser). Accordingly, in some embodiments, a feedback controller may be integrated in the signal driver 715 or elsewhere in the electronics system 160 to help provide a constant bias voltage. For example, a feedback controller may include a resistive voltage divider that reduces the bias voltage to within the operating range of the microcontroller (such as 3 volts), and an analog to digital converter (ADC) of the microcontroller may digitize the value of the bias voltage. Based on the ADC reading, the duty cycle may be adjusted using a proportional controller. In some embodiments, performance may be further improved by implementing feedforward control that anticipates dynamic load increases.

In some embodiments, the bias voltage 420 may be varied and/or otherwise controlled. In such embodiments, however, a designer must ensure that output from the signal driver 715 (which is effectively equal to the difference between biasing voltage 420 and alternating voltage signal 440) is sufficient to operate the piezo actuator 170.

Figure 10A:
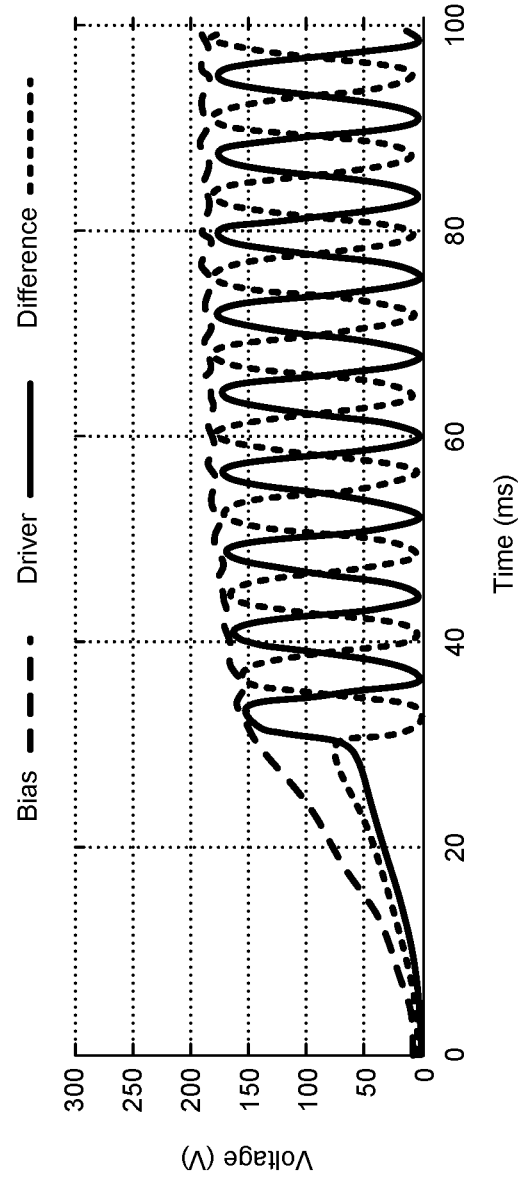
FIGS. 10A and 10B are display diagrams of waveforms output by a signal driver that is also controlling the biasing voltage, in accordance with embodiments of the present technology.
Figure 10B:
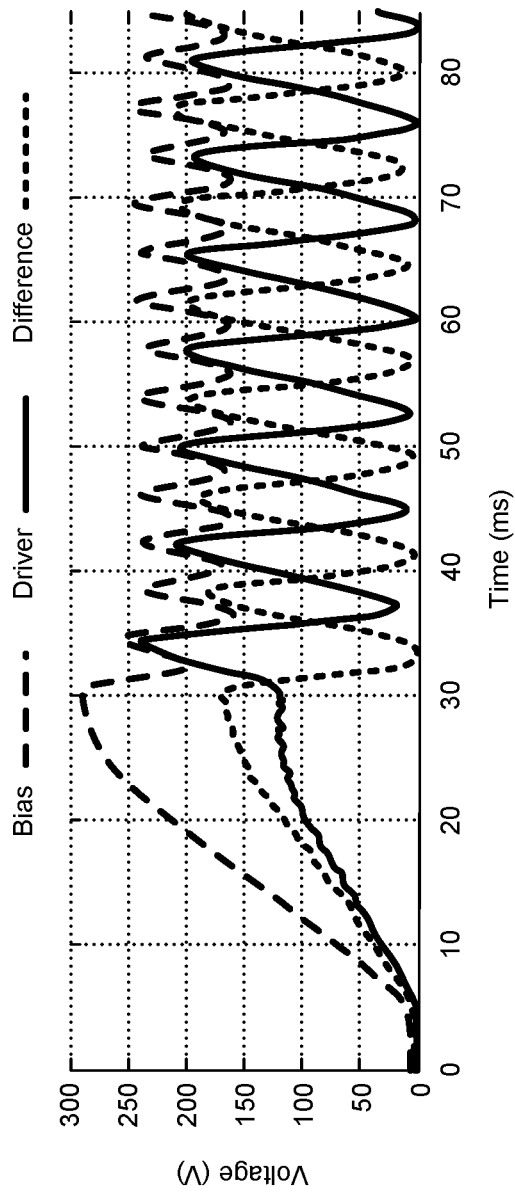

FIGS. 10A and 10B, for example, are display diagrams of waveforms output by a signal driver that is also controlling the biasing voltage in accordance with embodiments of the present technology. In some embodiments, a capacitor may be positioned on the bias rail 420 (see FIG. 7) to control the biasing voltage 420. For example, FIG. 10A shows a waveform output by a signal driver with a 100 nano-farad capacitor on the bias rail 420. FIG. 10B shows a waveform output by a signal driver with a 660 picofarad capacitor on the bias rail 420. The larger (e.g., 100 nano-farad) capacitor produces a consistent bias output, thereby reducing the need for feedback control to maximize wing displacement, at a cost of increased weight relative to other capacitors (e.g., 16 milligrams). In contrast, the smaller capacitor (e.g., 660 picofarad, which may weigh two milligrams) causes the waveform to vary significantly. However, as shown in FIG. 10B, the two voltages supplied to the piezo actuator (bias 420 and driver signal 440) have a sinusoidal shape that is offset by 180 degrees, which is sufficient for operating the piezo actuator. Accordingly, small capacitors with reduced mass may function in embodiments of the present technology, which further reduces overall weight of the robot. It will be appreciated that different capacitors may be used in additional embodiments.

Figure 11:
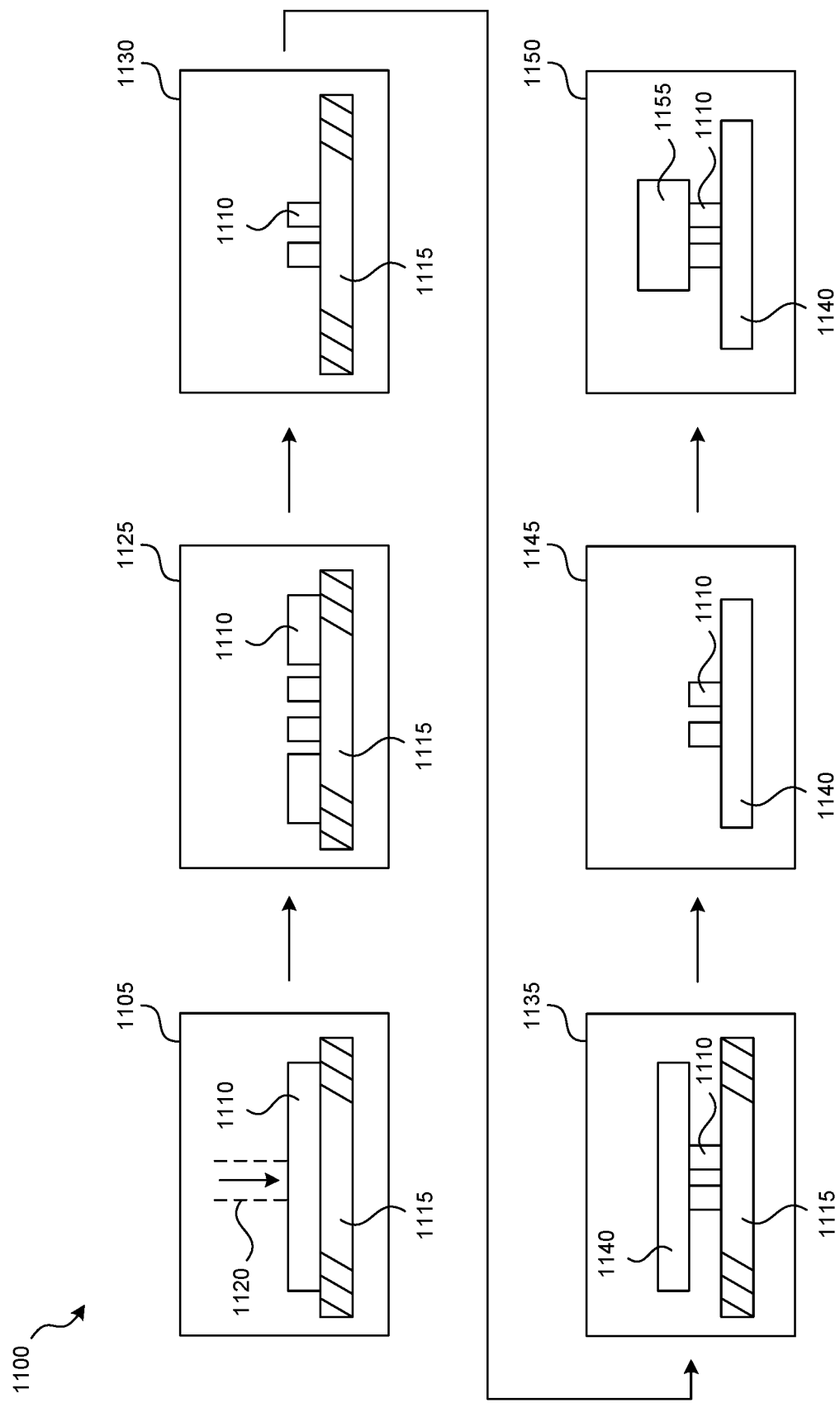
FIG. 11 is a process view of a method for manufacturing an electronics system in accordance with embodiments of the present technology.

FIG. 11 illustrates a method 1100 for manufacturing an electronics system 160 in accordance with embodiments of the present technology. The electronics system 160, for example, may be manufactured in a rapid prototyping process that results in a light-weight circuit. In some embodiments, the electronics system 160 may be manufactured without requiring chemical etching. In some embodiments, the same equipment (e.g., a laser) used to manufacture other parts of the robot may be used in the method illustrated in FIG. 11.

Referring first to block 1105, a sheet of copper foil 1110 is cleaned (for example, with isopropanol) and positioned on a base adhesive 1115, such as a low-tack adhesive. The copper foil 1110 may have a thickness of 25 micrometers or other suitable thicknesses. The base adhesive 1115 may include, for example, a suitable elastomer material sold under the trademark GELPAK from Gel-Pak of Hayward, Calif. A micromachining system 1120, such as a laser micromachining system (e.g., an ultraviolet laser system) cuts out the desired copper traces. In some embodiments, a 20 micrometer spot size is sufficient to cut copper traces suitable for implementation in the present technology. In other embodiments, however, other suitable spot sizes may be used.

In block 1125, a cleaning raster may be performed to improve adhesion of the copper 1110. In block 1130, excess copper is removed from the base adhesive 1115, leaving only the desired copper traces. In block 1135, a polymer film 1140 coated with adhesive (e.g., a polyimide tape sold under the trademark KAPTON from DuPont and having a thickness of approximately 25 micrometers), is positioned on the copper 1110. In block 1145, the base adhesive 1115 is removed from the copper 1110, for example, by peeling the adhesive-coated polymer film 1140 away from the base adhesive 1115, carrying the copper 1110 with it. In block 1150, electronic components 1155, such as components of the electronics system 160 described herein, may be positioned on and connected to the copper traces 1110.

In some embodiments, because the electronics system 160 may only have components on a single side and/or because the electronics system 160 may not include solder mask or an insulating layer (for example, to minimize weight), some copper traces may short contacts on smaller component parts. To avoid this, in some embodiments, holes may be precut in the polymer film 1140 at the desired solder ball sites, and the holes may be aligned during the adhesion step in block 1135. The component may be aligned and placed on the reverse side and soldered at the desired contact points through the holes in the film 1140. In some embodiments, an additional layer of polymer film 1140 may be positioned in the layering as a mask over the component.

In some embodiments, the method 1100 produces a flexible circuit that is approximately 50 micrometers thick, and with a density of approximately five to seven milligrams per square centimeter for a typical circuit design according to the technology. The method 1100 facilitates creation of a lightweight circuit to assist with successful untethered flight of aerial robots configured in accordance with embodiments of the present technology.

Advantages of the electronics system 160 configured in accordance with embodiments of the present technology also include providing sufficient voltage (such as 200 to 300 volts at 170 Hz, or other quantities) to operate the robot in a manner capable of flight, without excess weight that would otherwise limit or preclude flight. Manufacturing and assembly of the electronics system 160 may be performed quickly and at high volume due to the laser-based circuit fabrication technique described above and illustrated in FIG. 11.

Configurations of the electronics system 160 may be customized to adapt to other configurations of robots. The electronics system 160 may be constructed with commercially available components. In some embodiments, the electronics system 160 may be formed as a monolithic system-on-a-chip (SoC) design, such as a programmable SoC design. In some embodiments, the electronics system 160 may additionally or alternatively include one or more digital-to-analog converters implemented in a microcontroller, field-programmable gate arrays, and/or passive oscillator circuits to generate and/or control the waveform to drive the piezo actuators 170. Bundling the separate subsystems of the boost converter and signal drivers into integrated circuits may provide lighter weight and simplicity in fabrication than embodiments that employ discrete components. For example, the boost converter and driver subsystems can be fabricated onto a single wafer, by wafer thinning, and by otherwise integrating components.

As noted previously, weight has been a significant limitation for conventional aerial micro-robots, and such conventional micro-robots have been constrained to tethered flight because of such limitations. In contrast with conventional systems, however, the untethered aerial robot 100 disclosed herein weighs less than 200 milligrams and is expected to overcome the challenges associated with such conventional systems. FIG. 12, for example, is a table 1200 showing the weight of components and assemblies of a particular robot 100 configured in accordance with an embodiment of the present technology. Generally, the present technology enables flight of a sub-400 milligram aerial robot 100, and in particular, embodiments of the technology include flight of the lightest aerial robot to date, such as the first wireless liftoff of a sub-200 milligram aerial vehicle.

In the particular embodiment associated with the components listed in FIG. 12, a weight of 190 milligrams was achieved for the aerial robot. For example, in this particular embodiment, the boost converter 700, the signal driver 715, and the carriage frame 600 weigh a total of 73.7 milligrams. The microcontroller 730 and its associated electronics weigh 17.5 milligrams. The photovoltaic cell 140 and its lead wires (support elements 150) weigh approximately 13 milligrams. The robot 100-excluding the boost converter 700, signal driver 715, carriage frame 600, microcontroller 730, and the photovoltaic cell 140 and lead wires/support elements 150 (collectively, "PEU")—weigh approximately 73 milligrams. The disclosed arrangement is expected to provide the first sub-100 milligram boost converter and signal driver integrated into an aerial robot system. Miscellaneous glue and wiring contribute another 13 milligrams. As noted above, the total weight of the various components is only 190 milligrams.

C. Wireless Energy Systems and Methods

Figure 13:
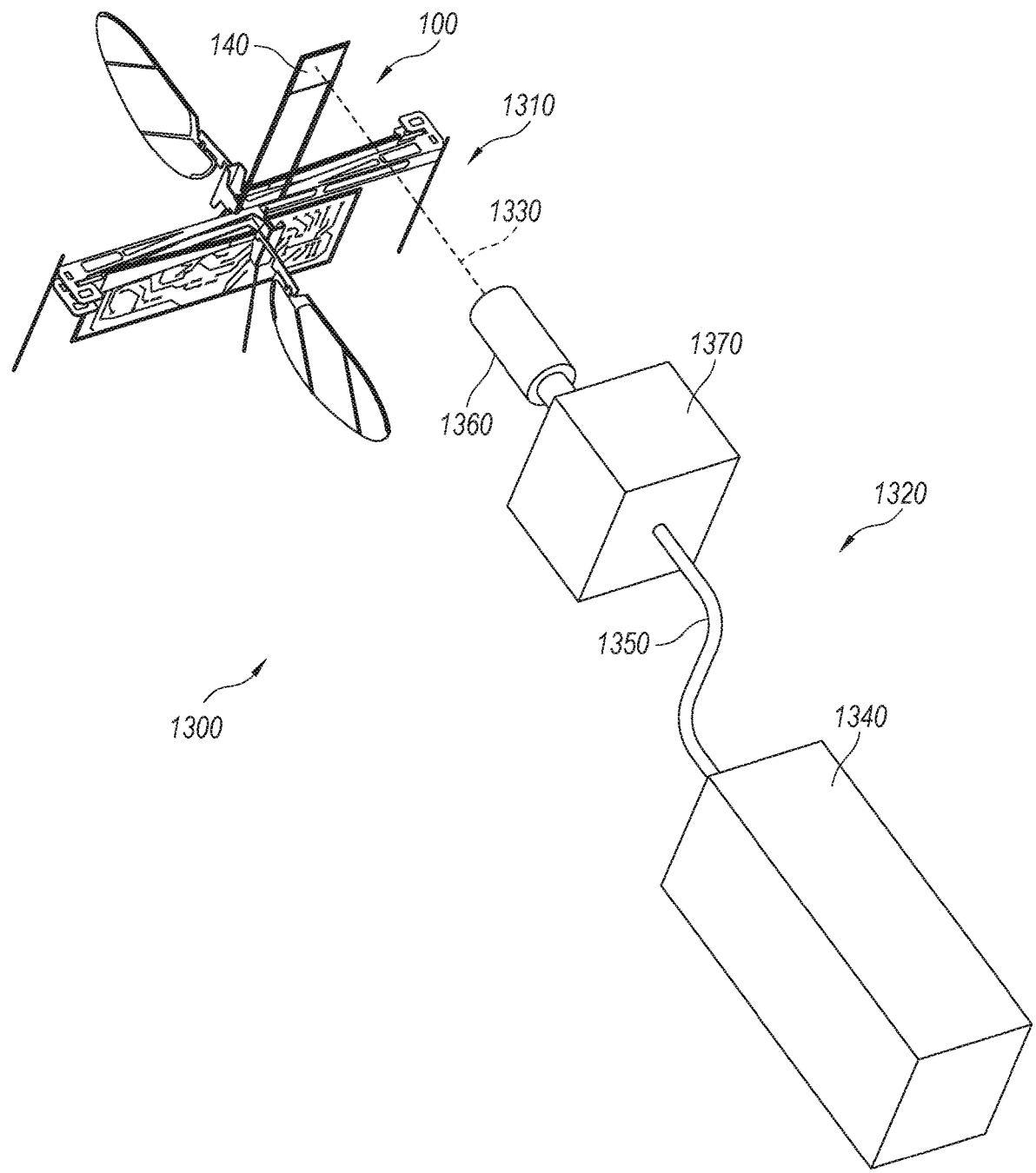
FIG. 13 is an isometric view of a robot system including a robot (such as an aerial robot) and a laser power delivery system configured in accordance with embodiments of the present technology.

FIG. 13 illustrates a robot system 1300 including the robot 100 and a laser power delivery system 1310 configured in accordance with embodiments of the present technology. In some embodiments, the laser power delivery system 1310 may include the photovoltaic cell 140 carried by the robot 100 and a laser source 1320 (on the ground or another support surface remote from the robot 100) configured to emit a laser beam 1330 oriented toward the photovoltaic cell 140 for conversion by the photovoltaic cell 140 into electrical energy to power the robot 100. In some embodiments, the laser source 1320 includes a laser source module 1340 producing light output 1350 that is connected to a collimator 1360 to produce the laser beam 1330 in free space. In one particular embodiment, the laser source 1320 may be a commercially-available laser source configured to produce a 976 nanometer laser. In other embodiments, however, other suitable laser sources and/or laser wavelengths may be used.

In some embodiments, a tracking system 1370 may support and move the collimator 1360 to keep the laser beam 1330 oriented toward the photovoltaic cell 140. Representative tracking systems include motion capture systems (e.g., a galvo mirror), optical feedback systems (using an additional laser aimed at a retroreflector on the robot), or chase vehicles. In some embodiments, the laser source 1320 and/or the tracking system 1370 may be configured to recognize the presence of a human in the laser beam and shut off to limit human exposure.

Aerial robots configured in accordance with the present technology (such as robot 100) do not need or include a battery, and can be powered wirelessly (untethered to a fixed or non-flying object) at ranges of one meter or more (or shorter ranges if desired) using the laser power delivery system 1310. In some embodiments, the laser source 1320 may have a longer range with higher power and a sufficiently collimated beam. Weight savings that facilitate flight of the aerial robot 100 are due, at least in part, to the absence of an onboard battery.

In some embodiments, other light sources or other wireless energy transmission systems may be used, such as magnetic induction or microwave systems. Suitable energy systems should deliver sufficient power for flight and have operating ranges that facilitate flight over suitable distances. Although a photovoltaic cell 140 is disclosed, the power electronics unit (electronics system 160) is designed such that any onboard source within size and weight payload requirements and comparable to the photovoltaic cell 140 in voltage and impedance can readily take the place of the photovoltaic cell 140. An aerial robot 100 configured in accordance with embodiments of the present technology may require between 200 and 300 milliwatts of power and 25 milliamps of current, which is provided by embodiments of the present technology.

EXAMPLES

Several aspects of the present technology are set forth in the following examples.

1. An aerial robot system, comprising:
an aerial robot including—
  an airframe;
  a piezo actuator carried by the airframe;
  a wing carried by the airframe and connected to the piezo actuator;
  a photovoltaic cell carried by the airframe;
  a boost converter connected to the photovoltaic cell and configured to raise a voltage level of electrical energy; and
  a signal generator connected to the boost converter and configured to generate a periodic signal,
  wherein the piezo actuator is connected to the signal generator to move according to the periodic signal;
  —and
a laser source configured to emit a laser beam, wherein, during operation,
the photovoltaic cell carried by the airframe is configured to receive the laser beam from the laser source for conversion by the photovoltaic cell into electrical energy, and
the piezo actuator is configured to actuate the wing to move in a flapping motion, thereby generating aerodynamic force to move the aerial robot along a ground locomotive path or in aerial flight.

2. The aerial robot system of example 1, further comprising a transmission carried by the airframe and connecting the piezo actuator to the wing, wherein the piezo actuator is configured to actuate the transmission to move the wing in the flapping motion.

3. The aerial robot system of example 1 or 2 wherein the aerial robot comprises a torsional spring element connecting the wing to the transmission.

4. The aerial robot system of any one of examples 1-3 wherein the transmission comprises a plurality of flexure joints, and wherein the wing rotates relative to the airframe between an initial resting position and an operational angle of at least 40 degrees.

5. The aerial robot system of any one of examples 1-4 wherein the piezo actuator is a bimorph piezo actuator.

6. The aerial robot system of any one of examples 1-5 wherein the wing comprises a wing skeleton and a sheet of material carried by the wing skeleton.

7. The aerial robot system of any one of examples 1-6 wherein the aerial robot further comprises one or more support legs.

8. The aerial robot system of any one of examples 1-7 wherein the signal generator is a sinusoidal signal generator, and wherein the periodic signal is a sinusoidal signal.

9. The aerial robot system of any one of examples 1-8 wherein the aerial robot further comprises a controller programmed with instructions that, when executed, cause the boost converter to raise the voltage level of the electrical energy and cause the signal generator to generate the periodic signal.

10. The aerial robot system of any one of examples 1-9 wherein the laser source comprises a tracking system configured to cause the laser source to remain oriented toward the photovoltaic cell during flight of the aerial robot.

11. The aerial robot system of any one of examples 1-10 wherein the aerial robot weighs less than 200 milligrams.

12. The aerial robot system of any one of examples 1-11 wherein, during operation, the aerial robot is not tethered to a non-flying object.

13. The aerial robot system of any one of examples 1-12 wherein the aerial robot does not carry a battery.

14. A robot system, comprising:
a robot including a frame portion and a piezo actuator, wherein the frame portion comprises a receiving structure configured to hold a first end of the piezo actuator, and a transmission structure having one or more flexure joints, the transmission structure being connected to a second end of the piezo actuator opposite the first end;
a wing attached to the transmission structure;
a photovoltaic cell connected to the frame portion; and
an electronic component assembly operably coupled to the photovoltaic cell and the piezo actuator,
wherein, in use, the photovoltaic cell is configured to receive light energy from a remote energy source and convert the light energy to electrical energy,
wherein, in use, the electronic component assembly is configured to provide a periodic energy signal to the piezo actuator to cause the wing to oscillate and create aerodynamic force.

15. The robot system of example 14 wherein the wing is attached to the transmission structure with a torsionally resilient element extending generally transversely relative to the frame portion.

16. The robot system of example 14 or 15 wherein the transmission structure comprises one or more flexure joints, and wherein the piezo actuator causes the wing to oscillate relative to the frame portion between a first position and a second position that is at least 40 degrees of rotation away from the first position.

17. The robot system of any one of examples 14-16 wherein the receiving structure comprises one or more slots.

18. The robot system of any one of examples 14-17, further comprising one or more support legs positioned to support the robot on a surface.

19. The robot system of any one of examples 14-18 wherein the frame portion is a first frame portion and the piezo actuator is a first piezo actuator, and wherein the robot further comprises:
a second piezo actuator; and
a second frame portion attached to the first frame portion, wherein the second frame portion receives the second piezo actuator between a second receiving structure and a second transmission structure.

20. The robot system of any one of examples 14-19 wherein the piezo actuator comprises a bimorph piezo actuator, and wherein the periodic energy signal comprises a sinusoidal signal.

21. The robot system of any one of examples 14-20 wherein the frame portion is formed from layers of composite material and polymer film, and wherein the receiving structure and the transmission structure are integral with the frame portion.

22. The robot system of any one of examples 14-21 wherein the composite material comprises carbon fiber, and wherein the polymer film comprises polyimide film.

23. The robot system of any one of examples 14-22 wherein the electronic component assembly comprises a means for increasing a voltage level of the electrical energy, and a means for generating the periodic energy signal.

24. The robot system of any one of examples 14-23, further comprising a remote laser source.

25. The robot system of any one of examples 14-24 wherein the remote laser source is configured to emit a laser beam toward the photovoltaic cell to provide light energy to the photovoltaic cell.

26. The robot system of any one of examples 14-25 wherein, in use, the robot is not tethered to a fixed object.

27. The robot system of any one of examples 14-26 wherein the robot does not include a battery for providing power to a piezo actuator.

28. A propulsion system for an aerial robot, the propulsion system comprising:
a piezo actuator;
a photovoltaic cell configured to receive light energy and convert the light energy to electrical energy;
a boost converter operably coupled to the photovoltaic cell and configured to receive the electrical energy from the photovoltaic cell and increase a voltage of the electrical energy and output the increased voltage as a biasing voltage signal for the piezo actuator; and a signal driver operably coupled to the boost converter and configured to receive the biasing voltage signal and output an alternating voltage signal for the piezo actuator, wherein the piezo actuator is configured to receive the biasing voltage signal and oscillate according to the alternating voltage signal.

29. The propulsion system of example 28, further comprising a wing connected to the piezo actuator, wherein the wing oscillates to provide aerodynamic force for the robot.

30. The propulsion system of example 28 or 29 further comprising a controller programmed with instructions that, when executed, cause the boost converter to increase the voltage level of the electrical energy from the photovoltaic cell and to cause the signal generator to generate the alternating voltage signal.

31. The propulsion system of any one of examples 28-30 wherein the alternating voltage signal is a sinusoidal voltage signal.

32. The propulsion system of any one of examples 28-31 wherein the boost converter comprises a coupled inductor.

33. The propulsion system of any one of examples 28-32 wherein the biasing voltage signal is between 200 volts and 300 volts.

34. A method for manufacturing an electronics system for an aerial robot, the method comprising:
positioning a layer of copper on a base adhesive;
cutting the copper using a laser to form copper traces for connecting electronic components;
positioning a layer of polymer film on the copper traces;
removing the base adhesive from the copper traces; and
positioning one or more electronic components on the copper traces.

35. The method of example 34 wherein the polymer film comprises polyimide tape.

36. The method of example 34 or 35, further comprising removing excess copper to leave only the copper traces on the base adhesive.

CONCLUSION

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology, as those skilled in the relevant art will recognize. For example, while steps are presented in a given order, alternative embodiments may perform steps in a different order. Moreover, the various embodiments described herein may also be combined to provide further embodiments. For example, although one aspect of the present technology is untethered flight of a sub-200 milligram aerial vehicle, robots and systems configured in accordance with embodiments of the present technology may be scaled up or down in size and may include other suitable robots that may or may not fly. For example, aerial vehicles configured in accordance with embodiments of the present technology may be larger than 200 milligrams, smaller than 400 milligrams, between 200 milligrams and 400 milligrams, larger than 400 milligrams, smaller or larger than one gram, insect-sized, bumblebee-sized, or other sizes. In some embodiments, additional laser machining may remove unpopulated areas of the electronics system or structurally unnecessary portions of the airframe to further reduce weight.

Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Where the context permits, singular or plural terms may also include the plural or singular term, respectively. Additionally, the term "comprising" is used throughout to mean including at least the recited feature(s) such that any greater number of the same feature and/or additional types of other features are not precluded. To the extent any of the materials incorporated herein by reference conflict with the present disclosure, the present disclosure controls. It will also be appreciated that specific embodiments have been described herein for purposes of illustration, but that various modifications may be made without deviating from the technology. Further, while advantages associated with certain embodiments of the technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

We claim:

1. An aerial robot system, comprising:
an aerial robot including—
an airframe;
a piezo actuator carried by the airframe;
a wing carried by the airframe and connected to the piezo actuator;
a photovoltaic cell carried by the airframe;
a boost converter connected to the photovoltaic cell and configured to raise a voltage level of electrical energy; and
a signal generator connected to the boost converter and configured to generate a periodic signal,
wherein the piezo actuator is connected to the signal generator to move according to the periodic signal;
—and
wherein the aerial robot does not carry a battery,
a laser source configured to emit a laser beam, and
wherein, during operation,
the photovoltaic cell carried by the airframe is configured to receive the laser beam from the laser source for conversion by the photovoltaic cell into electrical energy, and
the piezo actuator is configured to actuate the wing to move in a flapping motion, thereby generating aerodynamic force to move the aerial robot along a ground locomotive path or in aerial flight.

2. The aerial robot system of claim 1, further comprising a transmission carried by the airframe and connecting the piezo actuator to the wing, wherein the piezo actuator is configured to actuate the transmission to move the wing in the flapping motion.

3. The aerial robot system of claim 2 wherein the aerial robot comprises a torsional spring element connecting the wing to the transmission.

4. The aerial robot system of claim 2 wherein the transmission comprises a plurality of flexure joints, and wherein the wing rotates relative to the airframe between an initial resting position and an operational angle of at least 40 degrees.

5. The aerial robot system of claim 1 wherein the aerial robot further comprises a controller programmed with instructions that, when executed, cause the boost converter to raise the voltage level of the electrical energy and cause the signal generator to generate the periodic signal.

6. The aerial robot system of claim 1 wherein the laser source comprises a tracking system configured to cause the laser source to remain oriented toward the photovoltaic cell during flight of the aerial robot.

7. The aerial robot system of claim 1 wherein, during operation, the aerial robot is not tethered to a non-flying object.

8. The aerial robot system of claim 1 wherein the boost converter and the signal generator are carried on a single substrate.

9. A robot system, comprising:
a robot including a frame portion and a piezo actuator, wherein the frame portion comprises a receiving structure configured to hold a first end of the piezo actuator, and a transmission structure having one or more flexure joints, the transmission structure being connected to a second end of the piezo actuator opposite the first end,
wherein the frame portion is formed from layers of composite material and polymer film, and wherein the receiving structure and the transmission structure are integral with the frame portion;
a wing attached to the transmission structure;
a photovoltaic cell connected to the frame portion; and
an electronic component assembly operably coupled to the photovoltaic cell and the piezo actuator,
wherein, in use, the photovoltaic cell is configured to receive light energy from a remote energy source and convert the light energy to electrical energy,
wherein, in use, the electronic component assembly is configured to provide a periodic energy signal to the piezo actuator to cause the wing to oscillate and create aerodynamic force.

10. The robot system of claim 9 wherein the wing is attached to the transmission structure with a torsionally resilient element extending generally transversely relative to the frame portion.

11. The robot system of claim 9 wherein the transmission structure comprises one or more flexure joints, and wherein the piezo actuator causes the wing to oscillate relative to the frame portion between a first position and a second position that is at least 40 degrees of rotation away from the first position.

12. The robot system of claim 9 wherein the frame portion is a first frame portion and the piezo actuator is a first piezo actuator, and wherein the robot further comprises:
a second piezo actuator; and
a second frame portion attached to the first frame portion, wherein the second frame portion receives the second piezo actuator between a second receiving structure and a second transmission structure.

13. The robot system of claim 9 wherein the electronic component assembly comprises a means for increasing a voltage level of the electrical energy, and a means for generating the periodic energy signal.

14. The robot system of claim 9, further comprising a remote laser source configured to emit a laser beam toward the photovoltaic cell to provide light energy to the photovoltaic cell.

15. The robot system of claim 14 wherein, in use, the robot is not tethered to a fixed object.

16. The robot system of claim 9 wherein the robot does not include a battery for providing power to a piezo actuator.

17. A propulsion system for an aerial robot that does not carry a battery, the propulsion system comprising:
a piezo actuator;
a photovoltaic cell configured to receive light energy and convert the light energy to electrical energy;
a boost converter operably coupled to the photovoltaic cell and configured to receive the electrical energy from the photovoltaic cell and increase a voltage of the electrical energy and output the increased voltage as a biasing voltage signal for the piezo actuator; and
a signal driver operably coupled to the boost converter and configured to receive the biasing voltage signal and output an alternating voltage signal for the piezo actuator,
wherein the piezo actuator is configured to receive the biasing voltage signal and oscillate according to the alternating voltage signal.

18. The propulsion system of claim 17, further comprising a wing connected to the piezo actuator, wherein the wing oscillates to provide aerodynamic force for the robot.

19. The propulsion system of claim 17 wherein the boost converter comprises a coupled inductor.

20. The propulsion system of claim 17 wherein the boost converter and the signal driver are carried on a single substrate.

* * * * *